(12) United States Patent
Wang et al.

(10) Patent No.: US 11,152,652 B2
(45) Date of Patent: Oct. 19, 2021

(54) FAST AND PRECISE DETECTION OF AN INTERNAL SHORT CIRCUIT ON A LITHIUM-ION BATTERY

(71) Applicant: University of Florida Research Foundation, Incorporated, Gainesville, FL (US)

(72) Inventors: Shuo Wang, Gainesville, FL (US); Amirhossein Moeini, Rolla, MO (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 156 days.

(21) Appl. No.: 16/538,292

(22) Filed: Aug. 12, 2019

(65) Prior Publication Data

US 2020/0083572 A1    Mar. 12, 2020

(51) Int. Cl.
  *H01M 4/02*      (2006.01)
  *H01M 10/48*     (2006.01)
  *G01R 31/396*    (2019.01)
  *H01M 10/0525*   (2010.01)

(52) U.S. Cl.
  CPC .......... *H01M 10/48* (2013.01); *G01R 31/396* (2019.01); *H01M 10/0525* (2013.01)

(58) Field of Classification Search
  CPC ..................................................... H01M 4/02
  See application file for complete search history.

(56) References Cited

FOREIGN PATENT DOCUMENTS

JP    2005-143221    *   6/2005

OTHER PUBLICATIONS

Moeini, Amirhossein et al. *A DC Link Sensor-Less Voltage Balancing Technique for Cascaded H-Bridge Multilevel Convergers With Asymmetric Selective Harmonic Current Mtigation-PWM*, IEEE Transactions on Power Electronic, vol. 33, No. 9, Sep. 2018, pp. 7571-7581.

Lu, Languang et al. *A Review on The Key Issues for Lithium-Ion Battery Management in Electric Vehicles*, Journal of Power Sources, vol. 226, (2013), pp. 272-288. DOI: 10.1016/j.jp0wsour.2012.10.060.

San Thanagopalan, Shriram et al. *Analysis of Internal Short-Circuit in a Lithium Ion Cell*, Journal of Power Sources, vol. 194, (2009), pp. 550-557. DOI: 10.1016/j.jpowsour.2009.05.002.

Zhao, Hui, et al. *Critical Parameter Design for a Cascaded H-Bridge With Selective Harmonic Elimination/Compensation Based On Harmonic Envelope Analysis for Single-Phase Systems*, IEEE Transactions on Industrial Electronics, Vo. 66, No. 4, Apr. 2019, pp. 2914-2925. DOI: 10.1109/TIE.2018.2842759.

(Continued)

*Primary Examiner* — Jacob B Marks
(74) *Attorney, Agent, or Firm* — Alston & Bird LLP

(57) ABSTRACT

Techniques to diagnose internal short circuits (ISCs) of a lithium-ion battery (LIB) are disclosed. The short circuit resistance data can help to detect the ISCs of a LIB as fast as possible. For the proposed detection techniques, a resistor-based circuit and an inductor-based circuit are disclosed for single-cell LIBs as well as for LIBs having multiple cells. Two topologies of the resistor-based circuits are disclosed to detect the ISCs of multi-cell LIBs.

13 Claims, 21 Drawing Sheets

(56) References Cited

OTHER PUBLICATIONS

Moeini, Amirhossein et al. *Design of Fast Charging Technique for Electrical Vehicle Charging Stations With Grid-Tied Cascaded H-Bridge Multilevel Converters*, 2018 IEEE Applied Power Electronics Conference and Exposition (APEC), San Antonio, TX, 2018, pp. 3583-3590. DOI: 10.1109/APEC.2018.8341621.
Seo, Minhwan et al. *Detection of Internal Short Circuit in Lithium Ion Battery Using Model-Based Switching Model Method*, Energies, vol. 10, No. 1, (2017). (13 pages). DOI: 10.3390/en.1001076.
Moeni, Amirhossein et al. *Improve Control to Output Dynamic Response and Extend Modulation Index Range With Hybrid Selective Harmonic Current Mitigation-PWM and Phase-Shift PWM for Four-Quadrant Cascaded H-Bridge Converters*, IEEE Transactions on Industrial Electronics, vol. 64, No. 9, Sep. 2017, pp. 6854-6863. DOI: 10.1109/TIE.2017.2686339.
Zhang, Mingxuan et al. *Internal Short Circuit Trigger Method for Lithium-Ion Battery Based on Shape Memory Alloy*, Journal of the Electrochemical Society, vol. 164, No. 13, (2017), pp. A3038-A3044.
Feng, Xuning et al. *Online Internal Short Circuit Detevtion for a Large Format Lithium Ion Battery*, Applied Energy, vol. 161, (2016), pp. 168-180. DOI: 10.1016/j.apenergy.2015.10.019.
Fang, Weifeng et al. *Study of Internal Short in a Li-Ion Cell-II. Numerical Investigation Using a 3D Electrochemical-Thermal Model*. Journal of Power Sources, vol. 248 (2014), pp. 1090-1098.
Moeini, Amirhossein et al. *The State of Charge Balancing Techniques for Electrical Vehicle Charging Stations With Cascaded H-Bridge Multilevel Converters*, In 2018 IEEE Applied Power Electronics Conference and Exposition (APEC), Mar. 4, 2018, pp. 637-644.

\* cited by examiner

FAST AND PRECISE DETECTION OF AN INTERNAL SHORT CIRCUIT ON A LITHIUM-ION BATTERY

FEDERALLY SPONSORED RESEARCH OR DEVELOPMENT

This invention was made with government support under 1540118 awarded by the National Science Foundation. The government has certain rights in the invention.

CROSS-REFERENCE TO RELATED APPLICATIONS

This application claims priority to U.S. Provisional Application No. 62/728,627, filed Sep. 7, 2018, the entire contents of which are incorporated herein by reference.

TECHNICAL FIELD

The present application relates to battery technology, and in particular, to a lithium-ion battery (LIB) short circuit detection technique.

BACKGROUND

Currently, rechargeable batteries are used to store electrical energy in various industries, such as renewable energies, grid-connected converters, electric vehicles (EVs) and their associated charging stations, aircrafts, smartphones, tablets, and laptops. lithium-ion batteries (LIBs), in particular, have several advantages in comparison to other types of rechargeable batteries. For example, LIBs may have higher energy densities, longer lifetimes, and faster charging processes. However, the ability to store large amounts of accessible energy in the form of a LIB raises some safety concerns, particularly relating to the potentially destructive energy releases that occur as a result of internal or external short circuits. For example, external short circuits (ESCs) occur between two terminals (e.g., positive and negative electrodes) of a LIB. Internal short circuits (ISCs), by contrast, occur as a result of undesirable, low or no resistance electrical connections between (a) the positive and negative electrodes of the LIB, (b) the positive and negative current collectors or terminals of the LIB, or (c) an electrode and an opposite current collector (e.g., between the positive electrode and the negative current collector, between the negative electrode and the positive current collector, and/or the like).

Because these ISCs are often associated with extremely fast temperature increases of the LIB, these short circuits can be catastrophically destructive both to the batteries themselves and to the batteries' surrounding environment. Hence, there remains a need to develop an easy and fast lithium-ion battery internal short circuit detection technique.

BRIEF SUMMARY

Embodiments of the current disclosure provide diagnostic circuits for detecting ISCs for a LIB. Various embodiments provide an accurate and fast estimation of short circuit resistances of ISCs, based at least in part on a calculation of the internal resistance of the battery.

Various embodiments are described herein for detecting ISCs of single-cell LIBs, including (1) a resistor-based ISC detection technique encompassing a test resistance and a power switch and/or (2) an inductor-based ISC detection technique encompassing an inductor with an H-bridge. Moreover, two detection techniques for detecting ISCs of multi-cell LIBs are discussed herein that are based at least in part on the single-cell resistor-based ISC detection techniques mentioned above.

The resistor-based ISC detection technique utilizes a resistor-based ISC detection circuit comprising a test resistor and a switch (e.g., a two-pole switch) that may be connected in parallel with a battery load (e.g., enabling the battery to provide electrical current to a desired circuit, such as a computing device, electrical vehicle, and/or the like); wherein a first end of the resistor-based ISC detection circuit (which is commonly referred to as a first end of the test resistor) and a first end of the battery load connect to a first external terminal of the battery, wherein the test resistor and the switch are connected in series within the resistor-based ISC detection circuit such that a second end of the test resistor connects to a first side (e.g., a first pole) of the switch; wherein a second end of the resistor-based ISC detection circuit (commonly referred to as a second end (e.g., a second pole) of the switch) and a second end of the battery load connect to the second external terminal of the battery; and wherein the switch is off when an ISC resistance is not measured, and wherein a transient current passes through the first and the second external terminals when the switch is turned on to measure the ISC resistance.

The inductor-based ISC detection technique utilizes an inductor-based ISC detection circuit connected in parallel with a battery load, wherein the inductor-based ISC detection circuit comprises: a measurement resistor and an H-bridge; wherein the H-bridge comprises an inductor and four switches (e.g., two-pole switches), wherein the inductor is in the center of the H-bridge and is located on an AC-side of the H-bridge, and the four switches are arranged to be on two arms of the H-bridge; wherein two top ends of the H-bridge connect to the first external terminal of the battery through the measurement resistor, and two bottom ends of the H-bridge connect to the second external terminal of the battery; and wherein the four switches are off when an ISC is not measured, and wherein a transient current on the measurement resistor is measured when the switches are turned on to detect the ISC.

Optionally, the inductor on the H-Bridge is arranged to have specific impedance to increase sensitivity of the ISC detection.

BRIEF DESCRIPTION OF THE DRAWINGS

Figure 1:
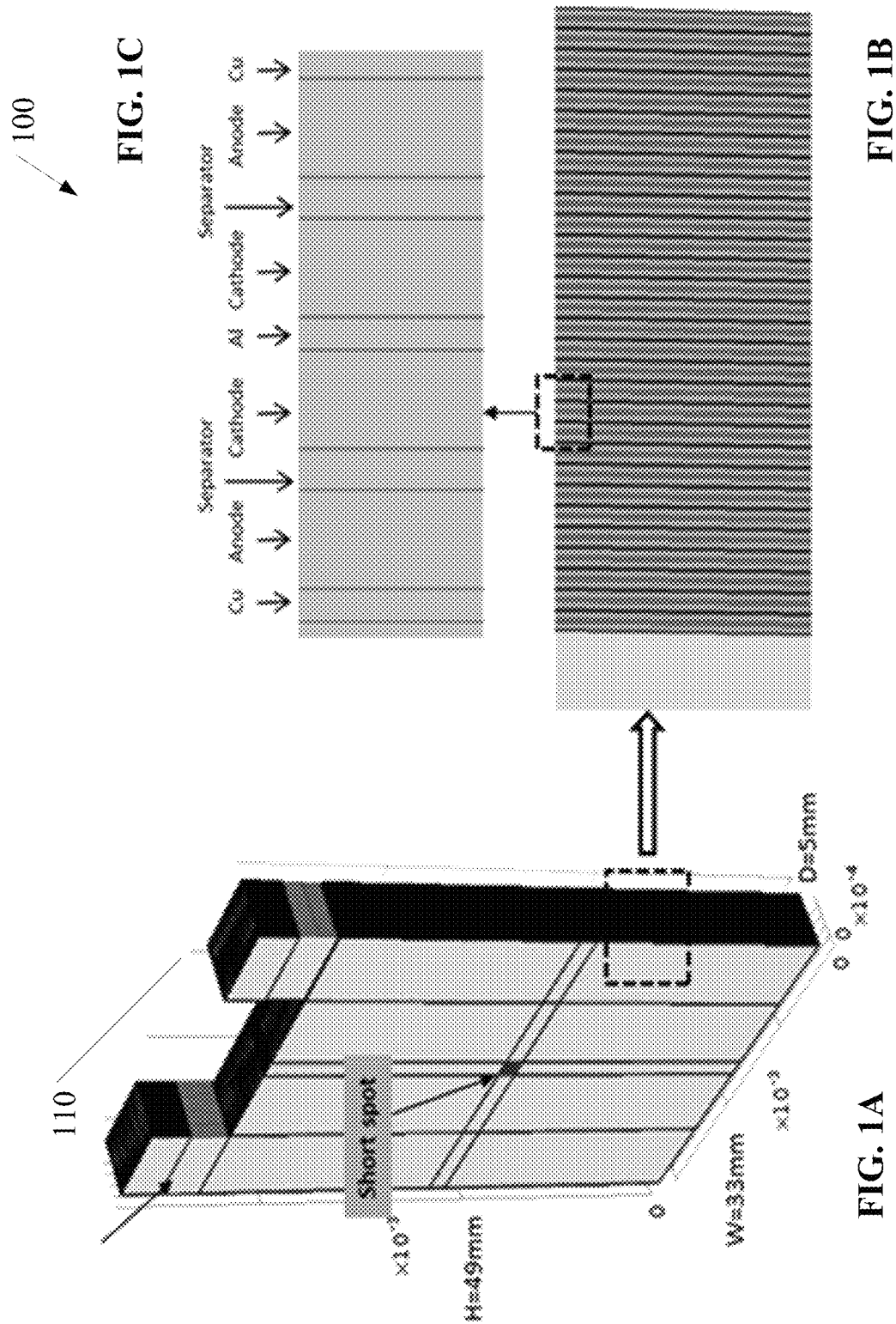
Figure 2:
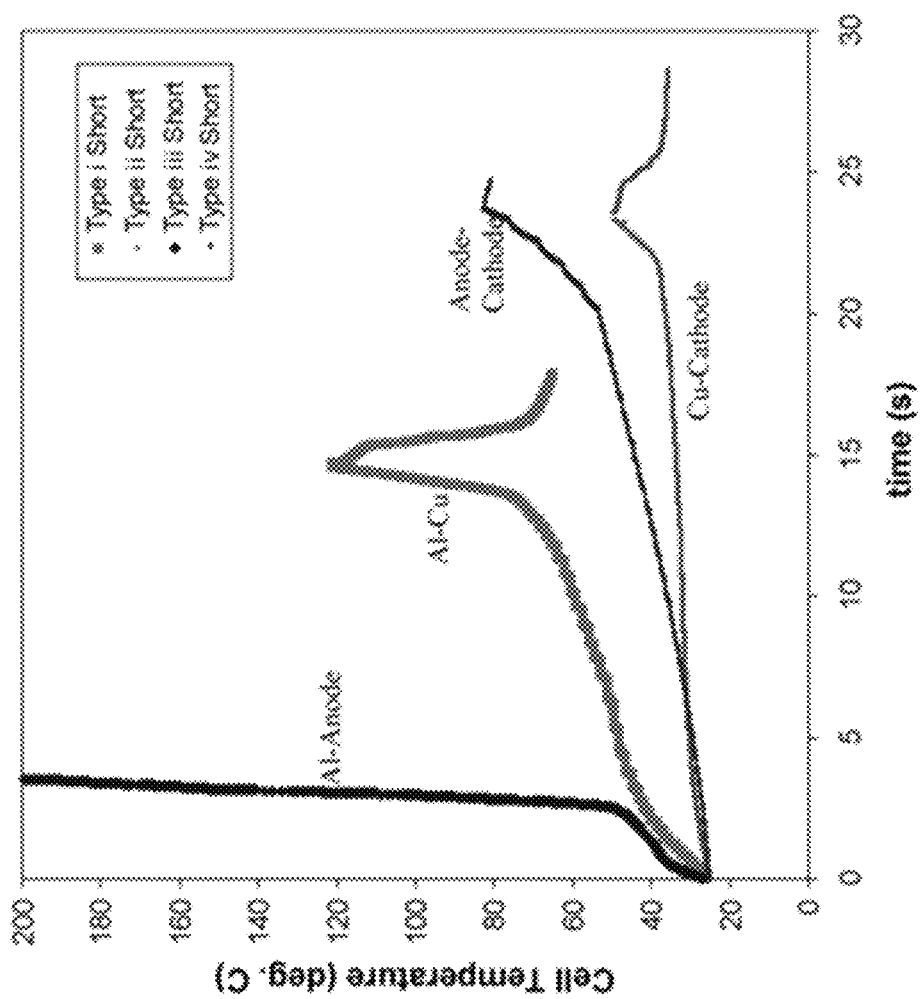
Figure 3:
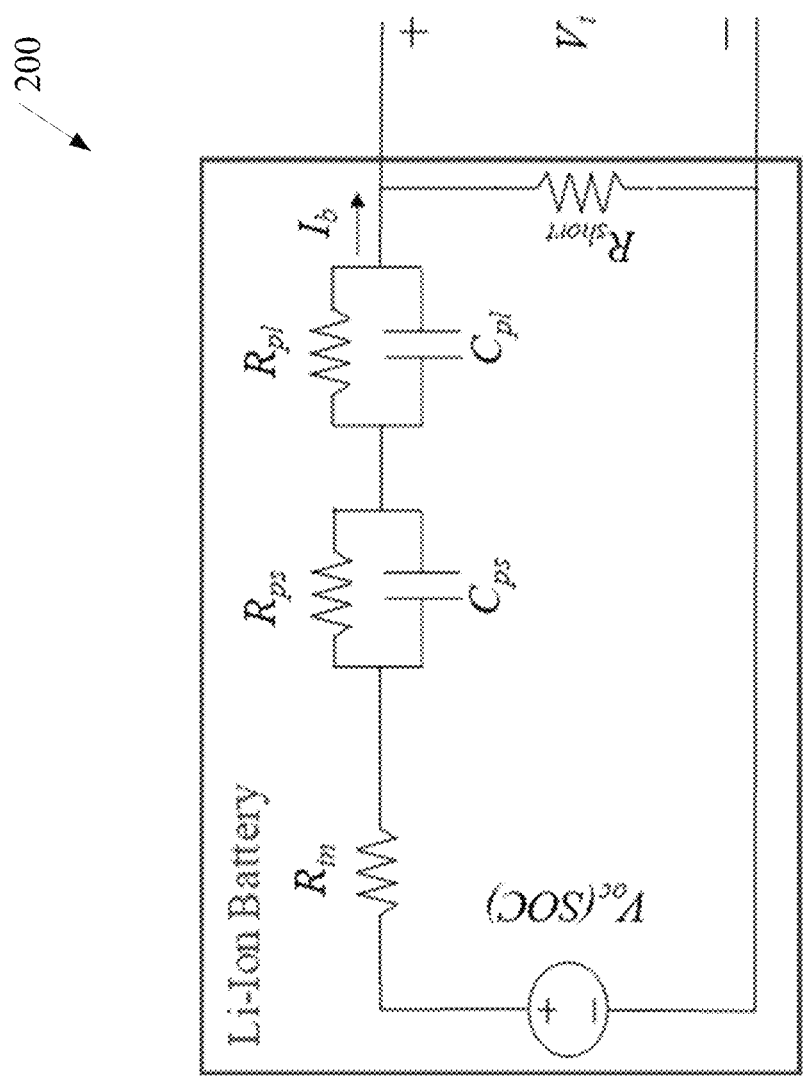
Figure 4A:
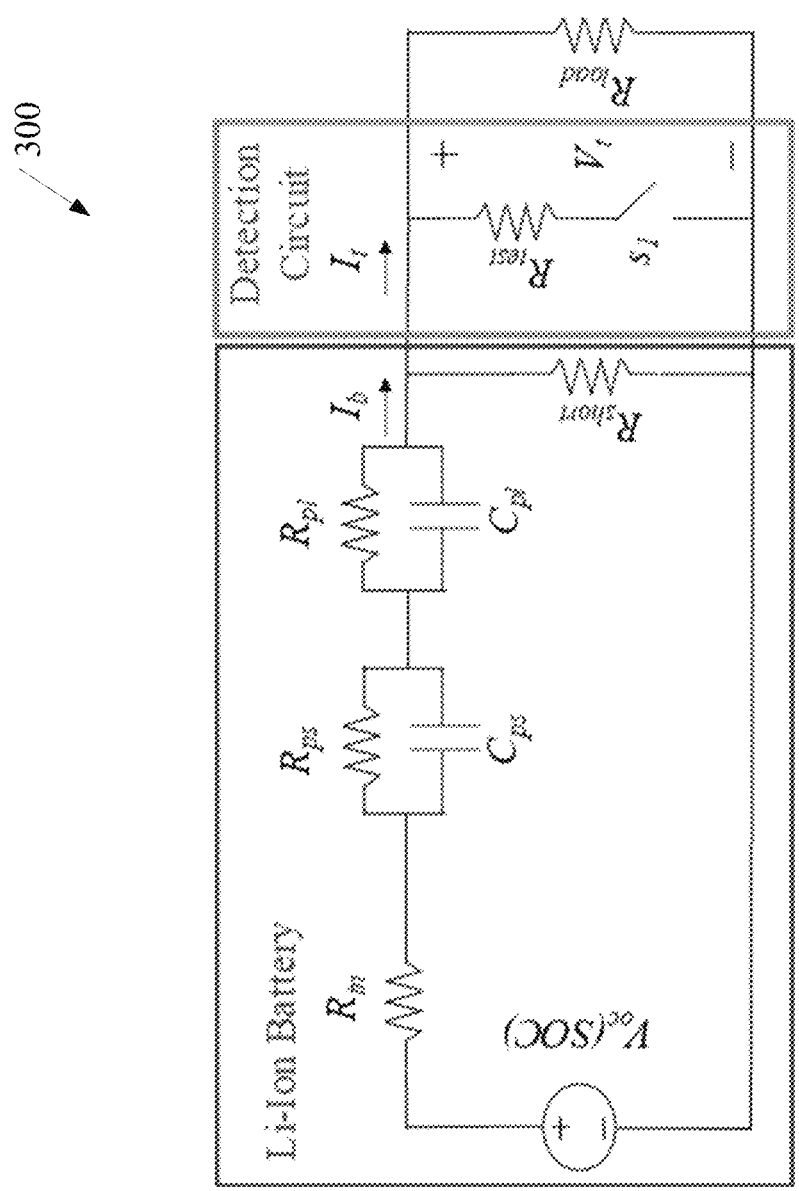
Figure 4B:
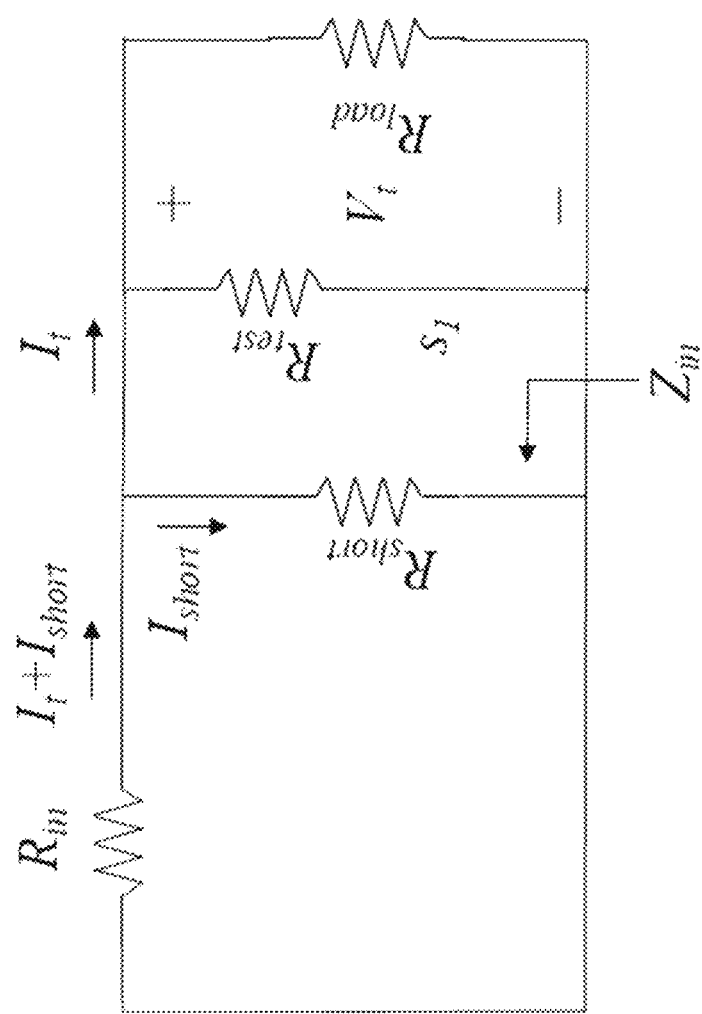
Figure 5A:
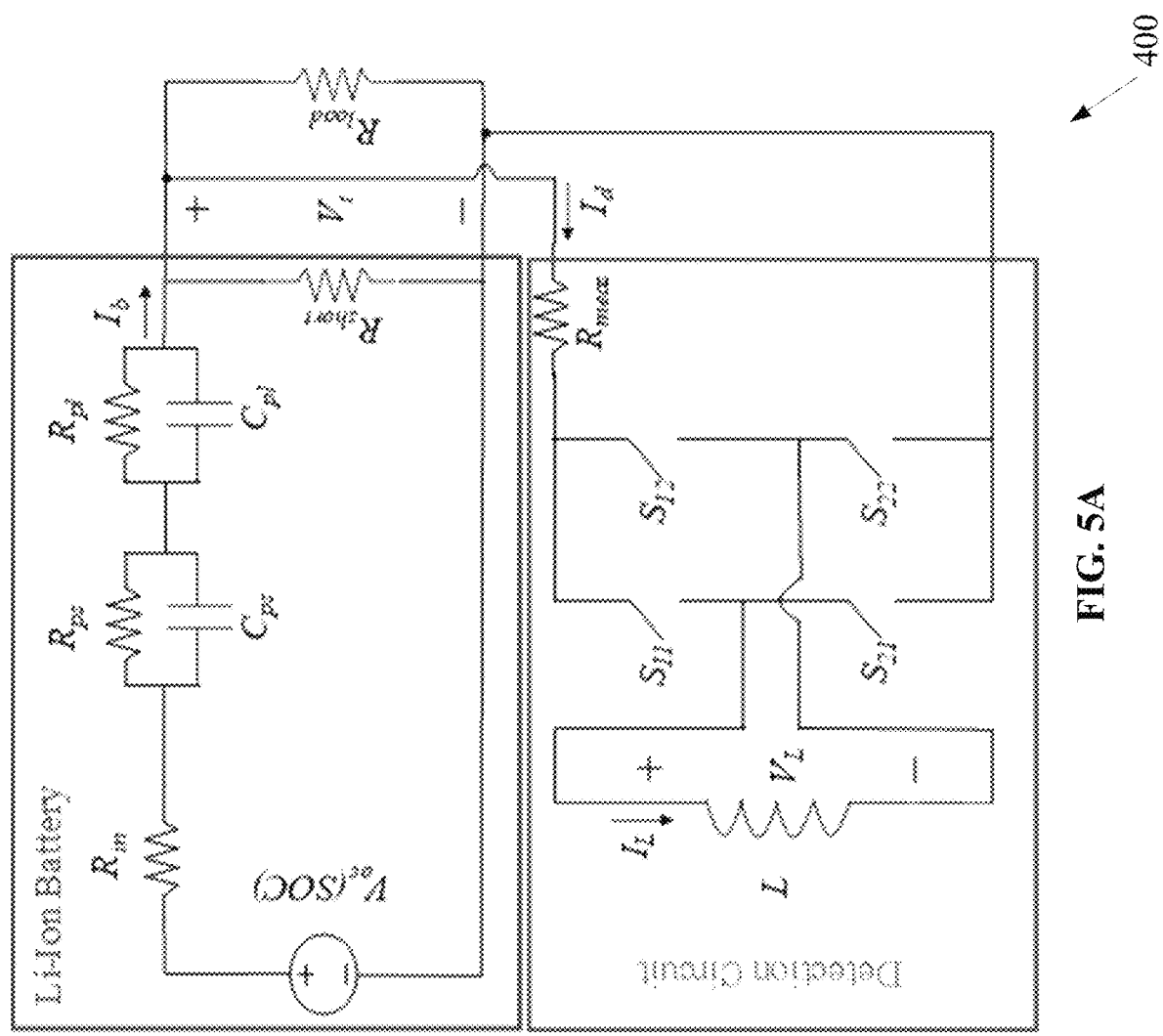
Figure 5B:
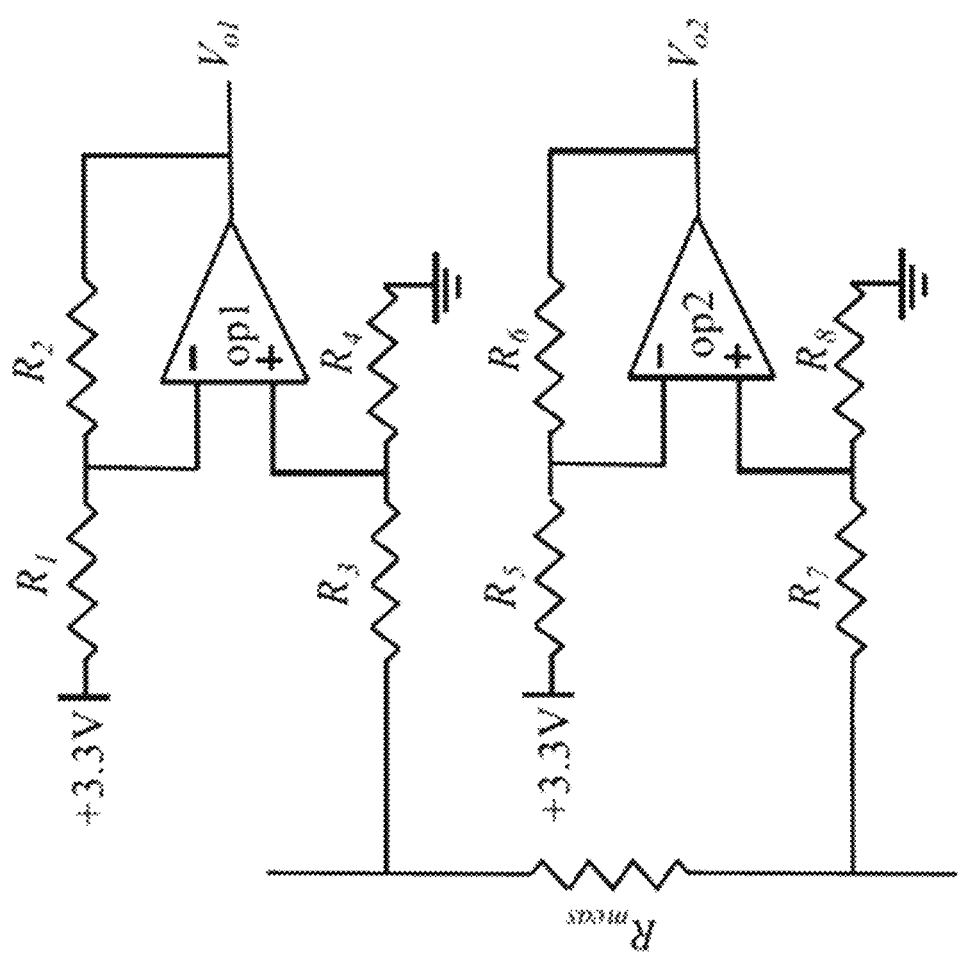
Figure 6:
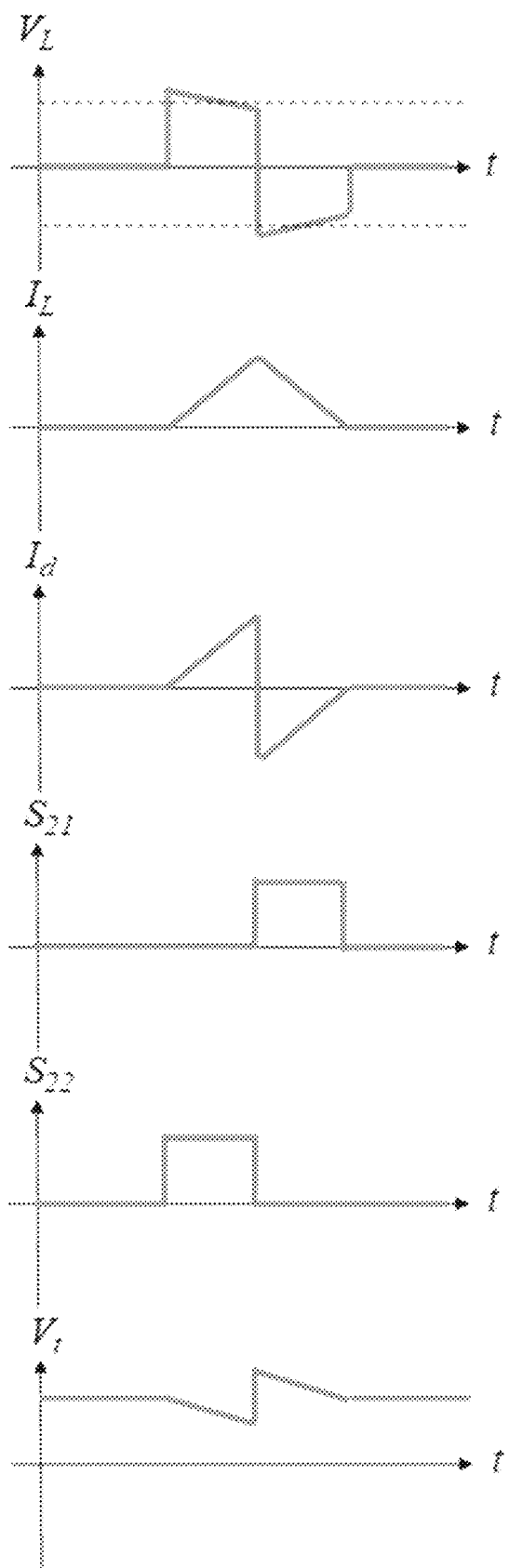
Figure 7:
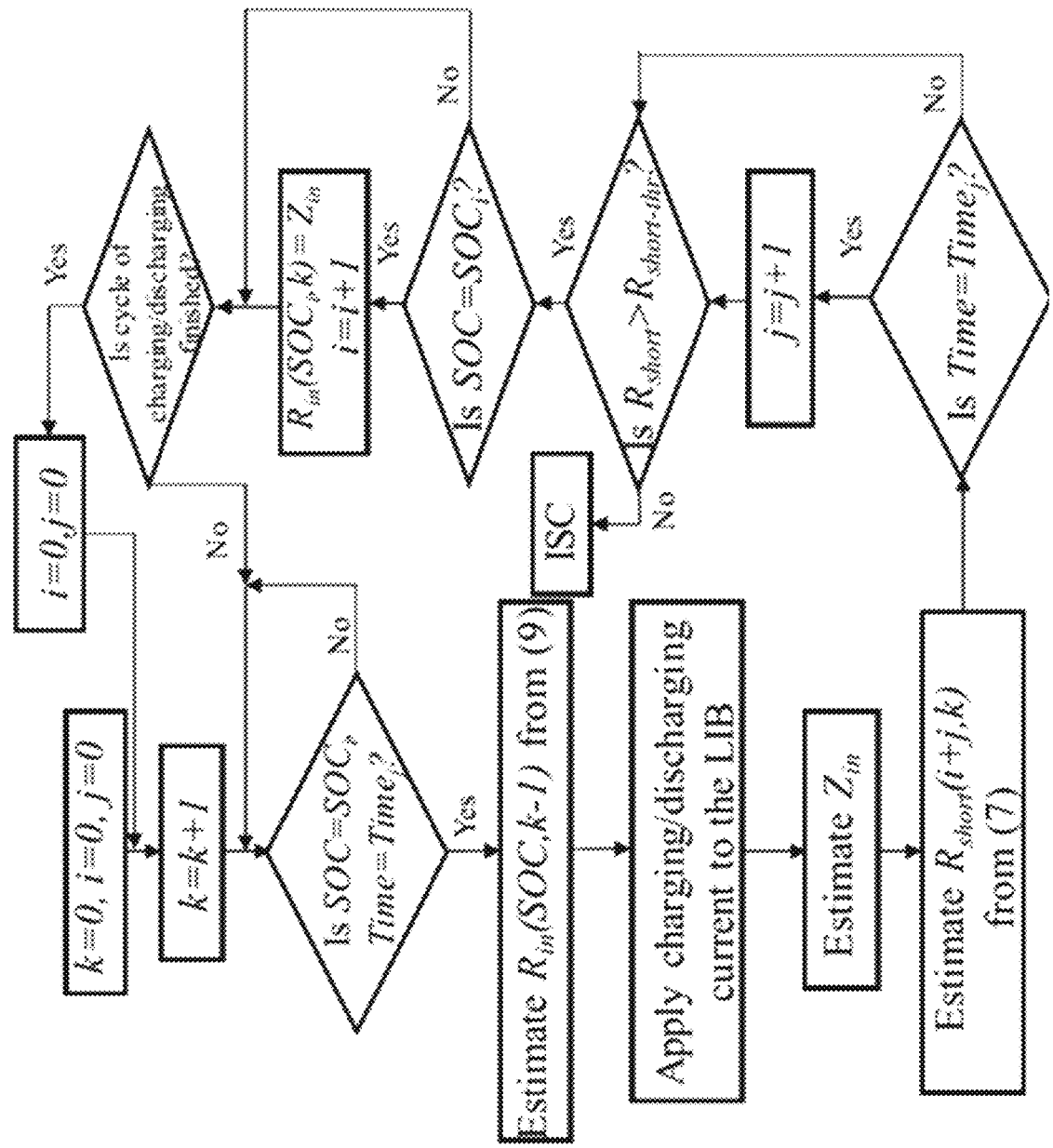
Figure 8:
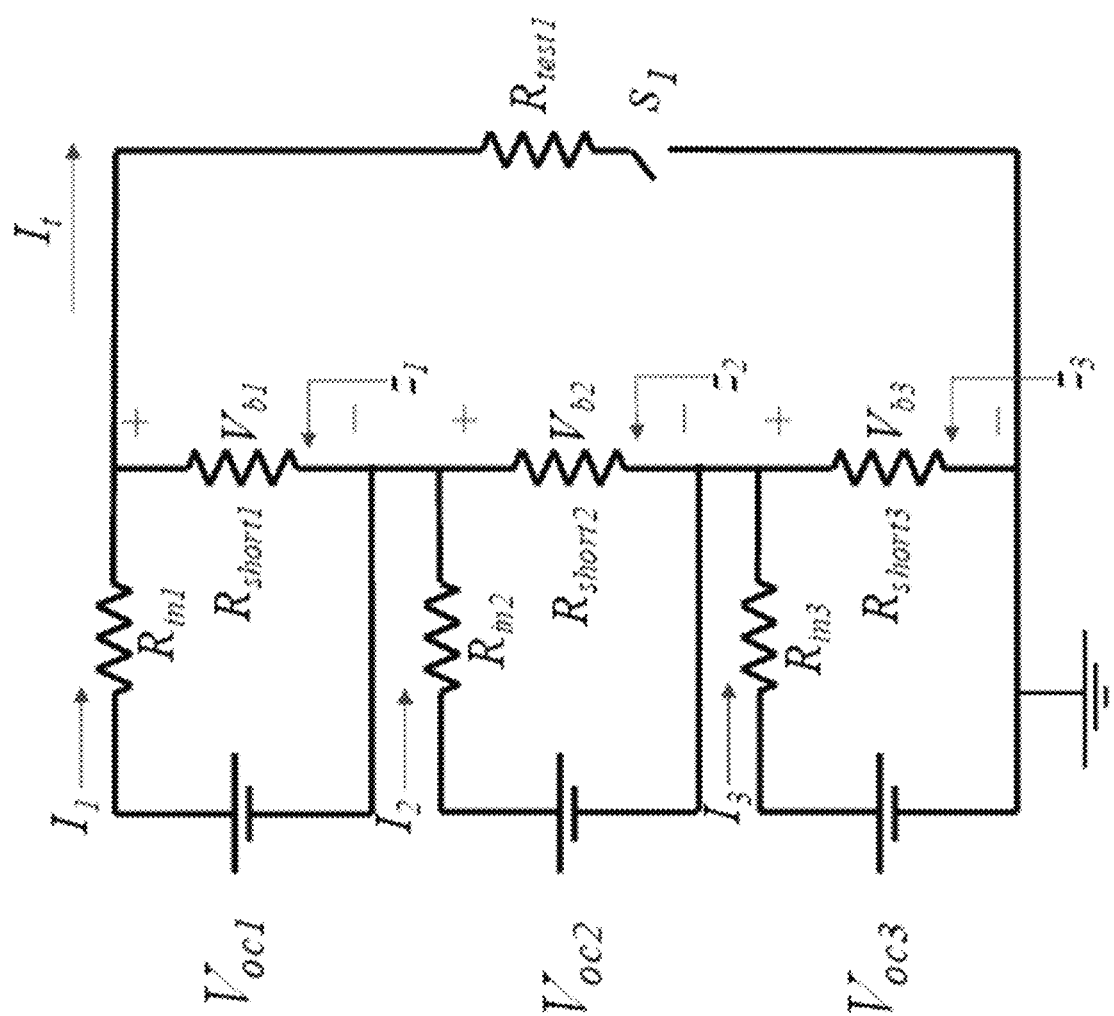
Figure 9:
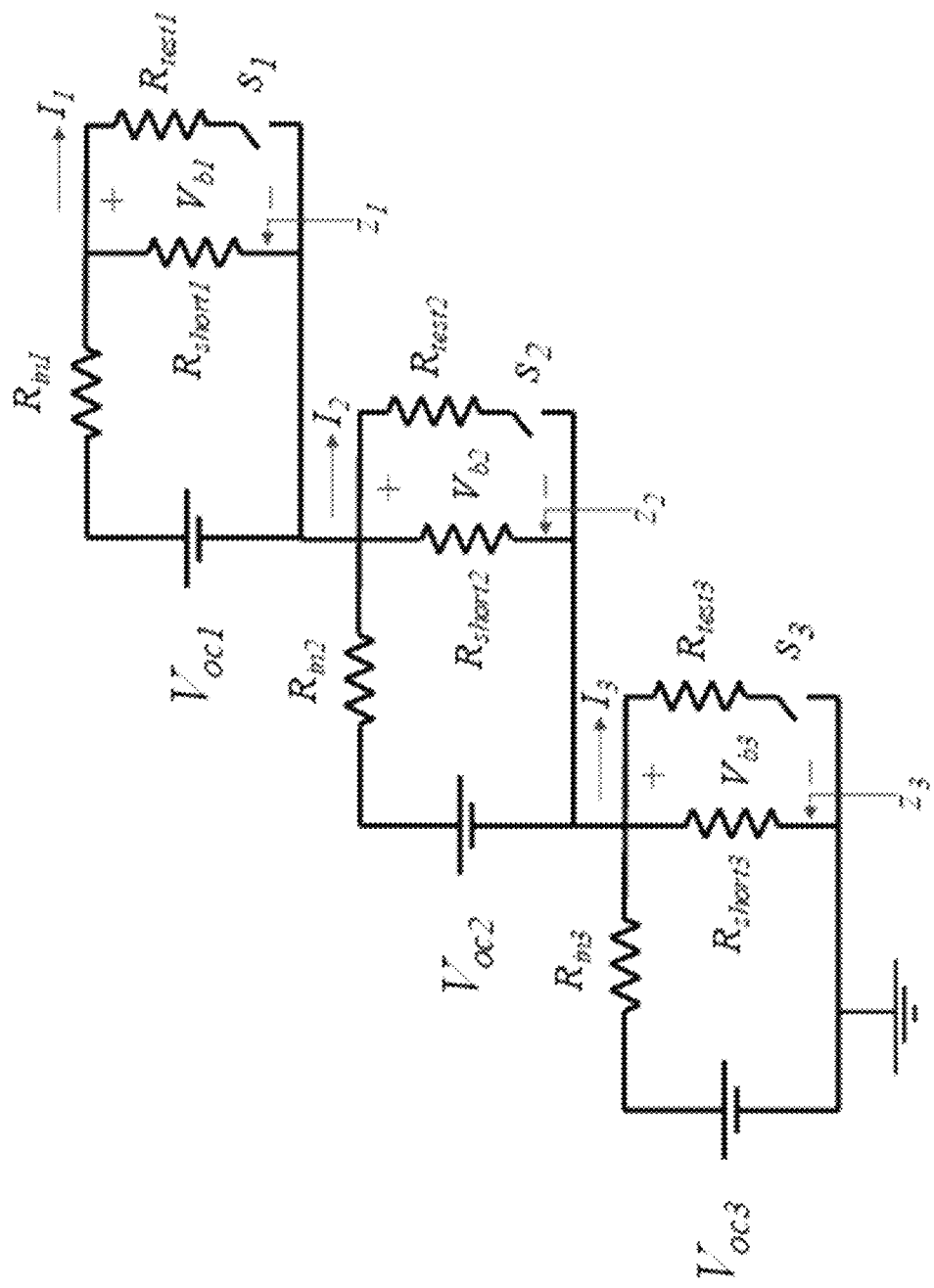
Figure 10A:
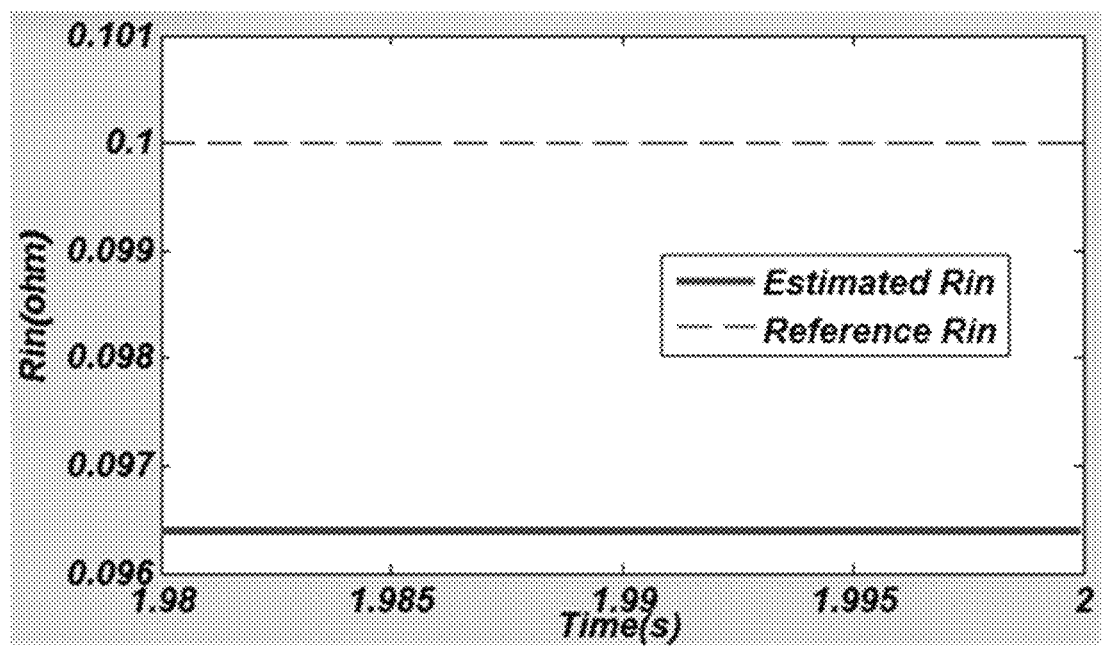
Figure 10B:
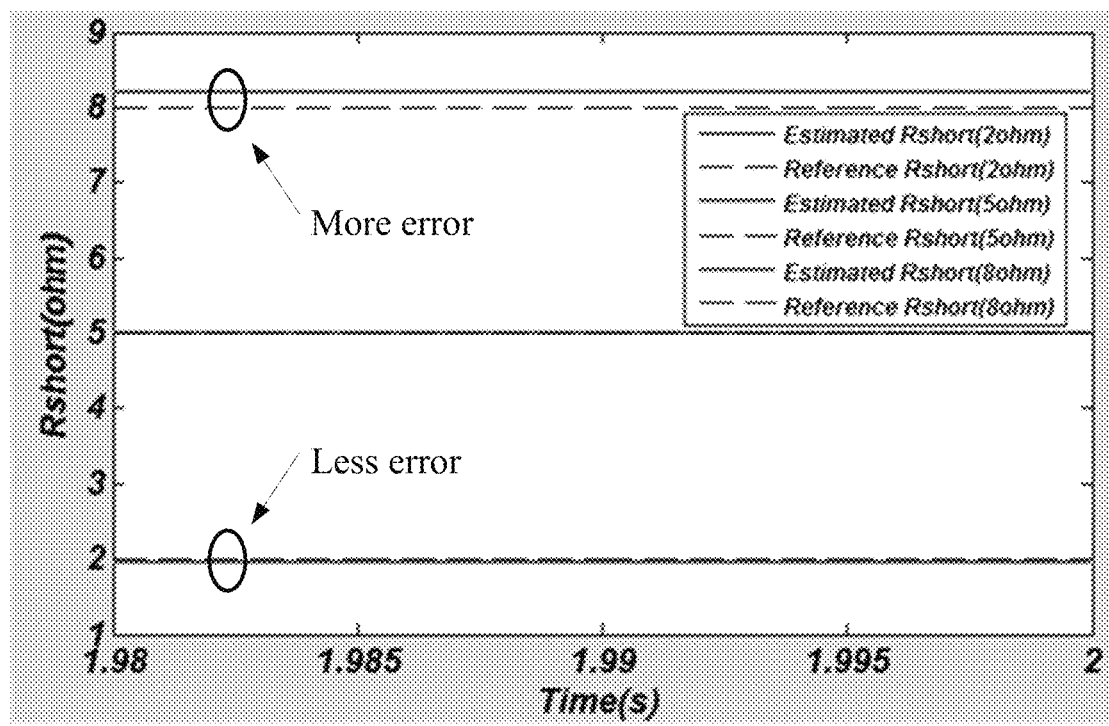
Figure 11A:
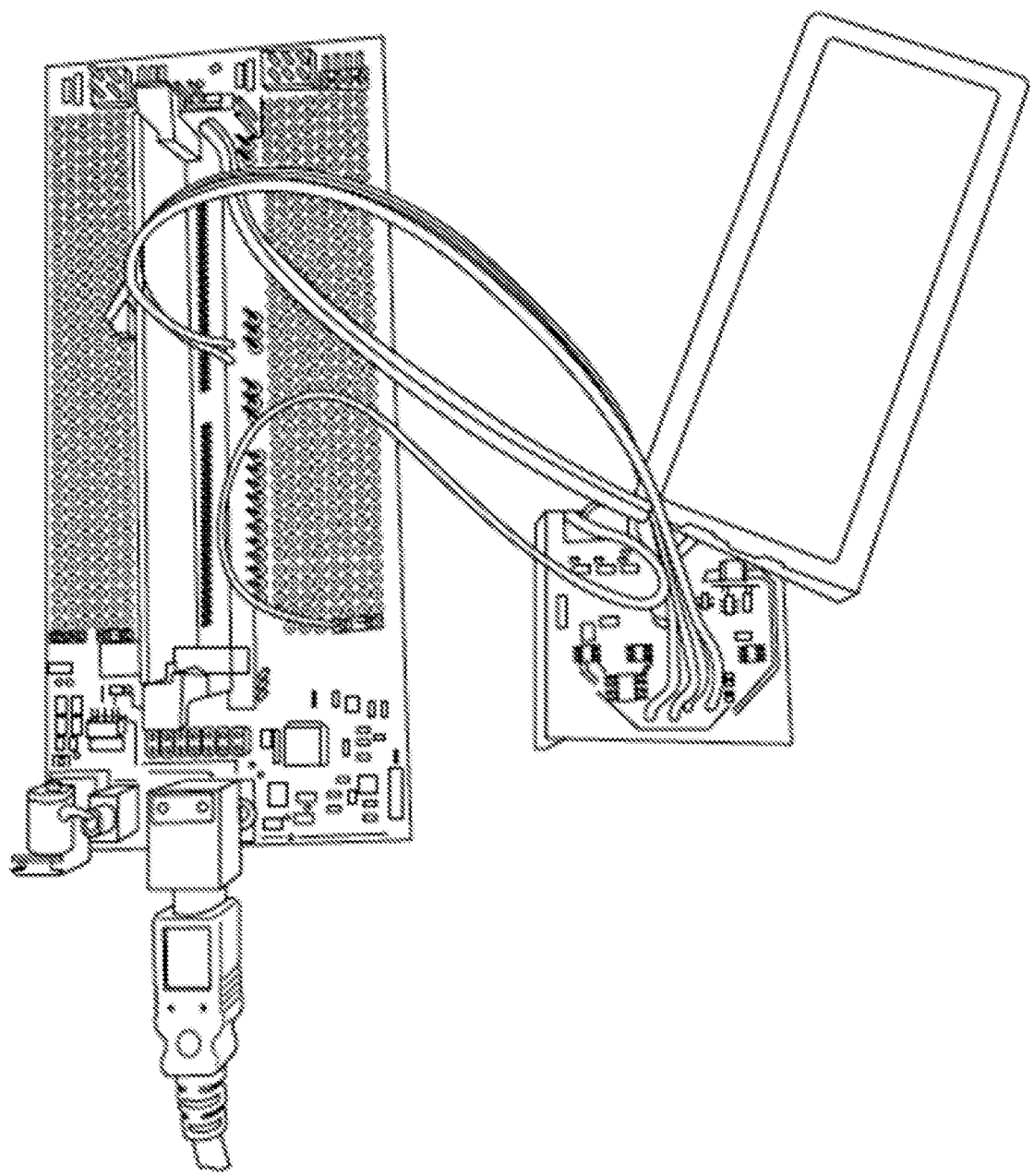
Figure 11B:
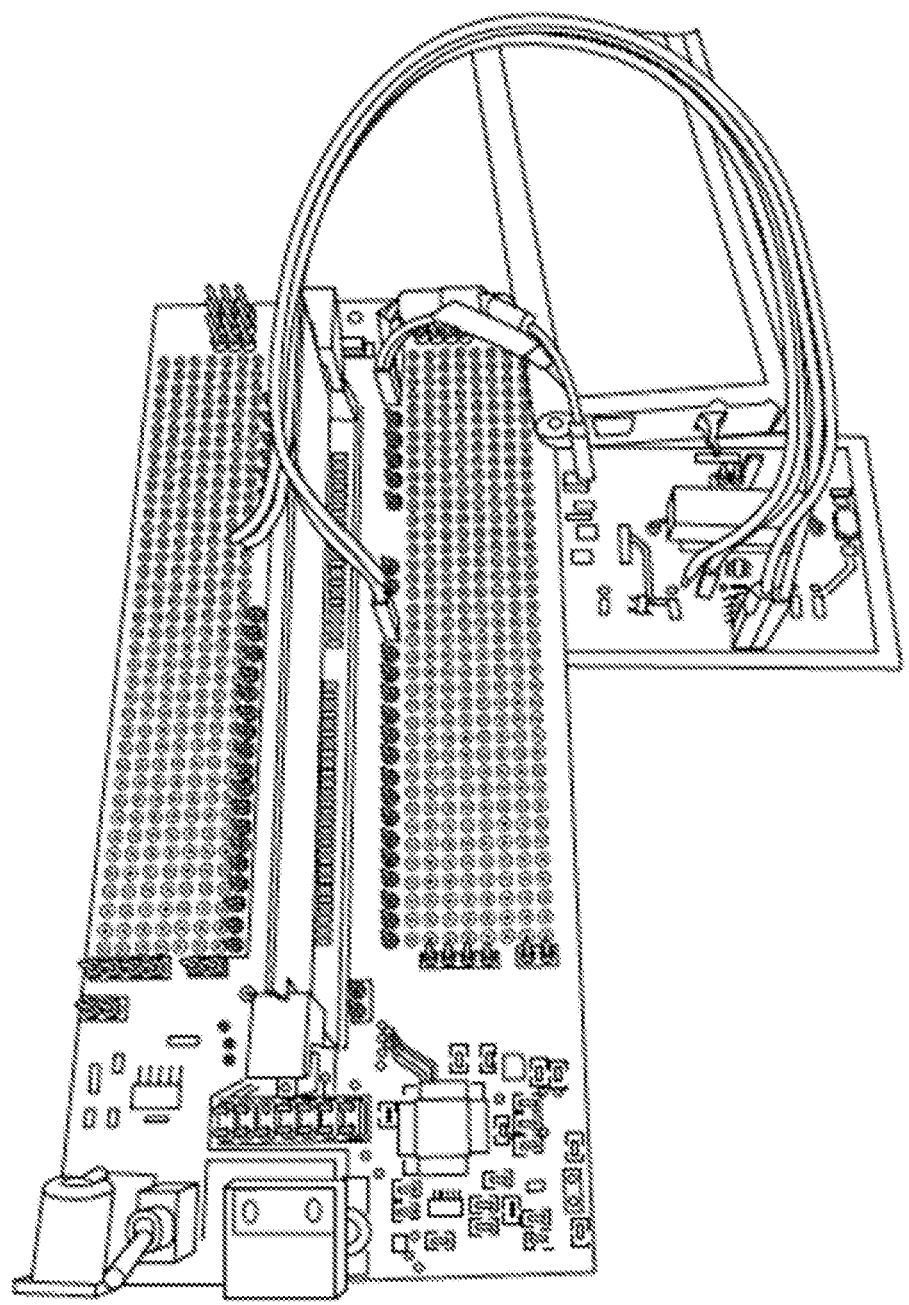
Figure 12A:
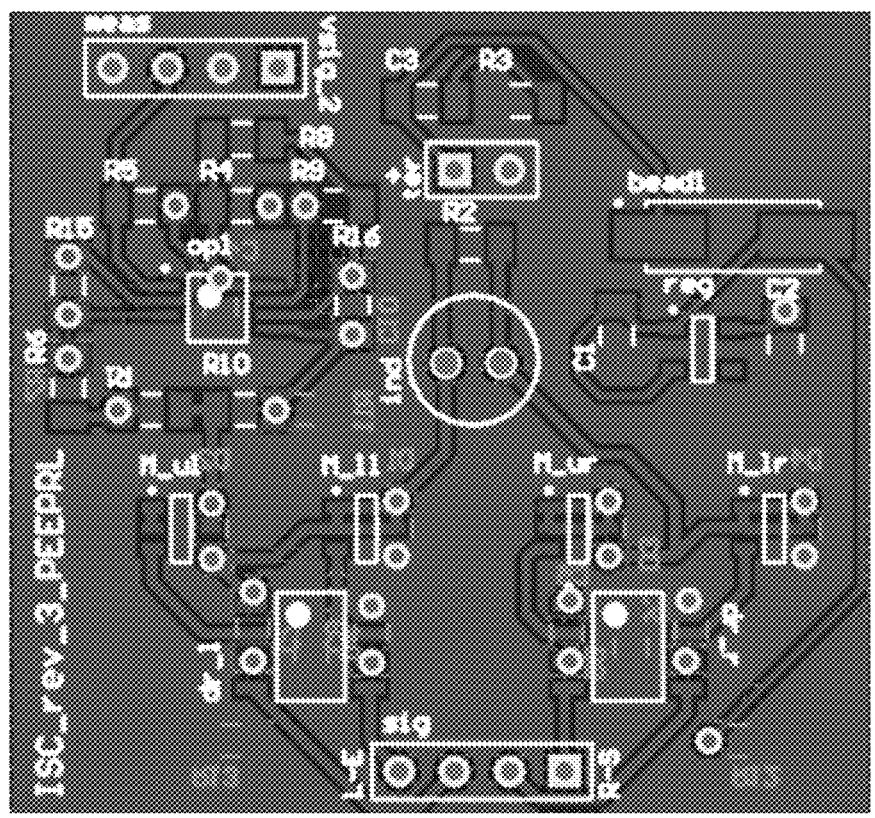
Figure 12B:
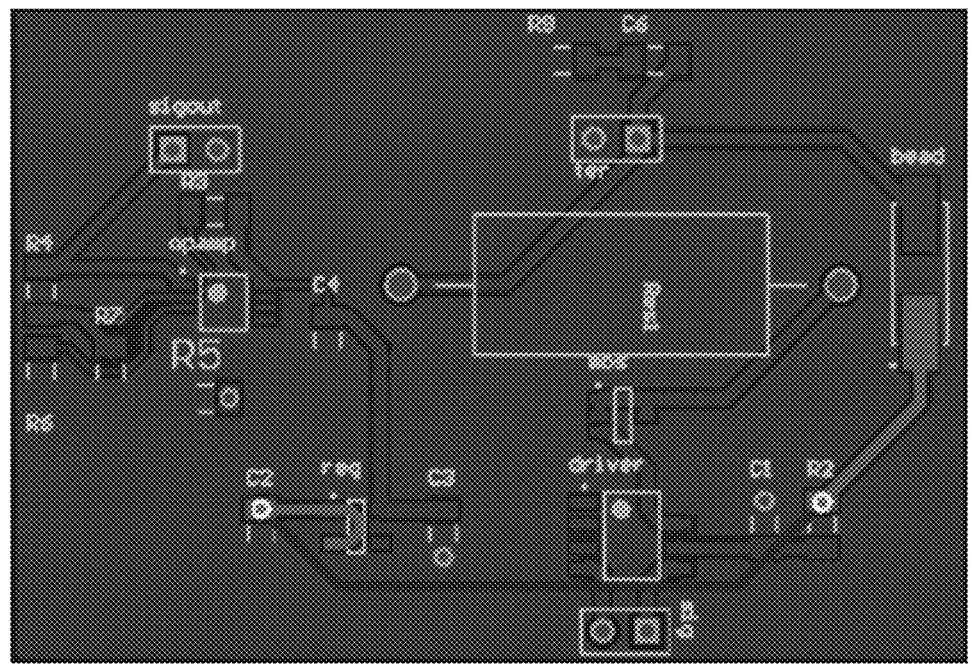
Figure 13:
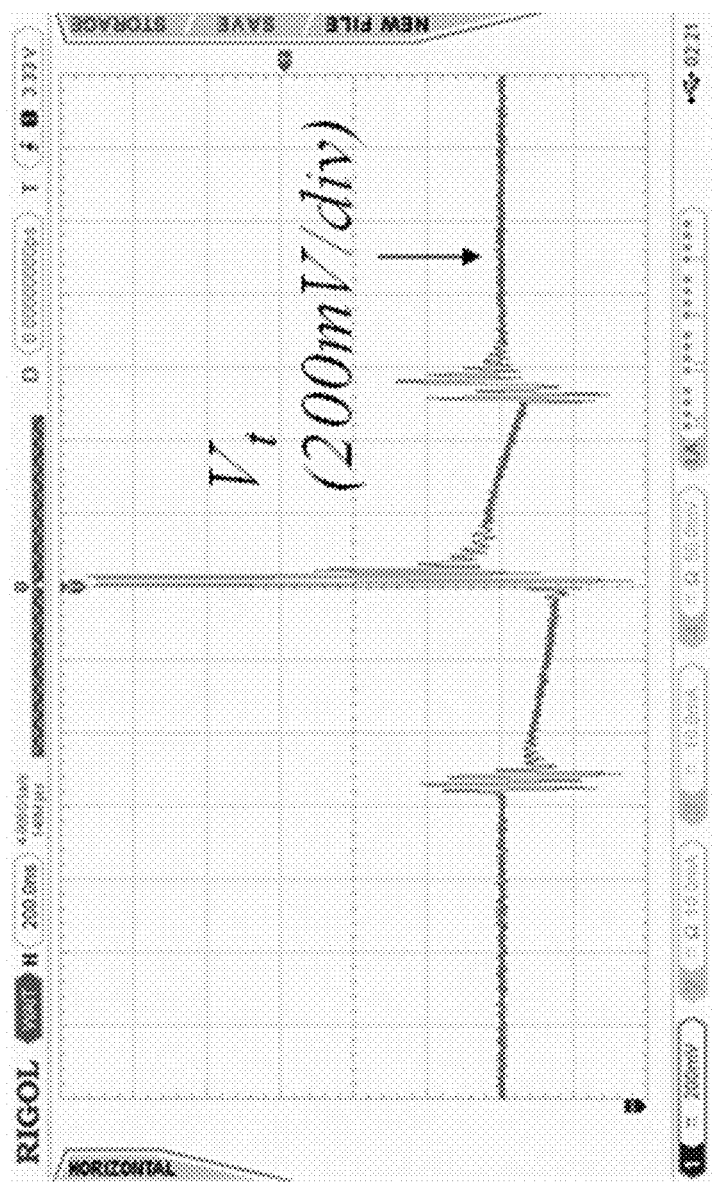
Figure 14A:
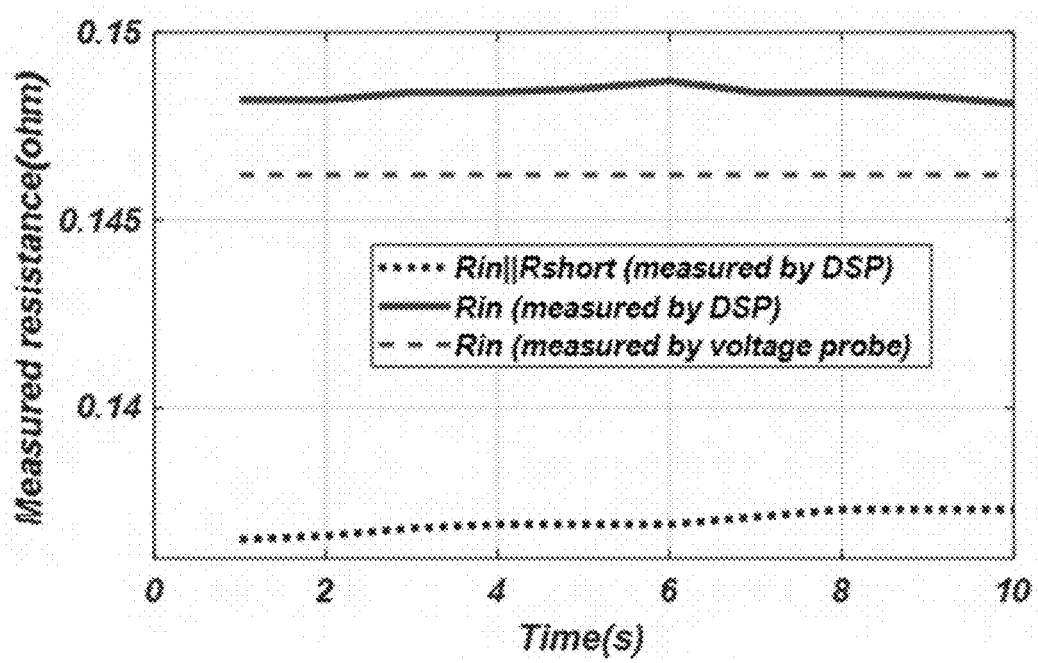
Figure 14B:
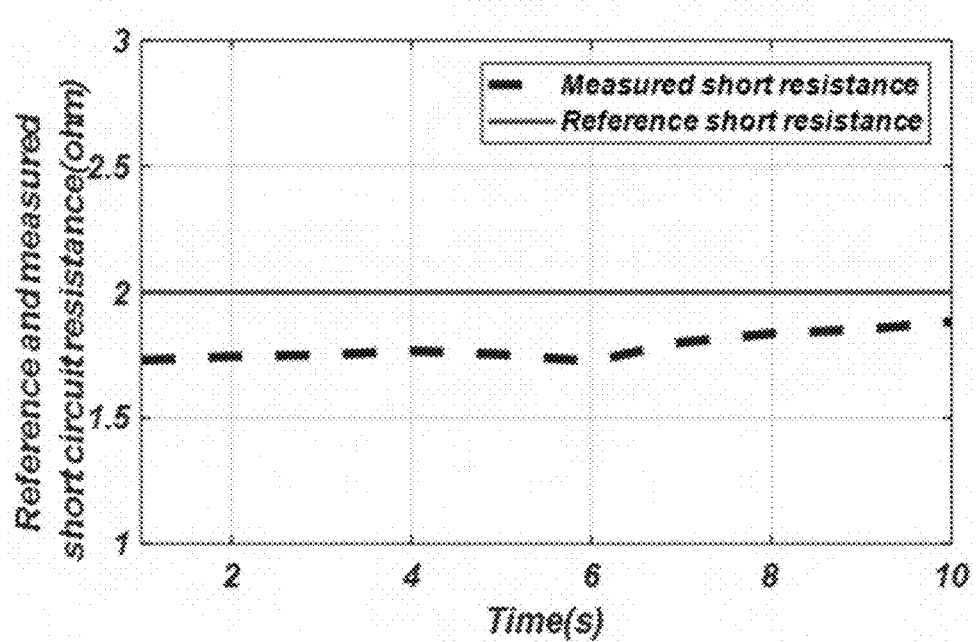
Figure 15A:
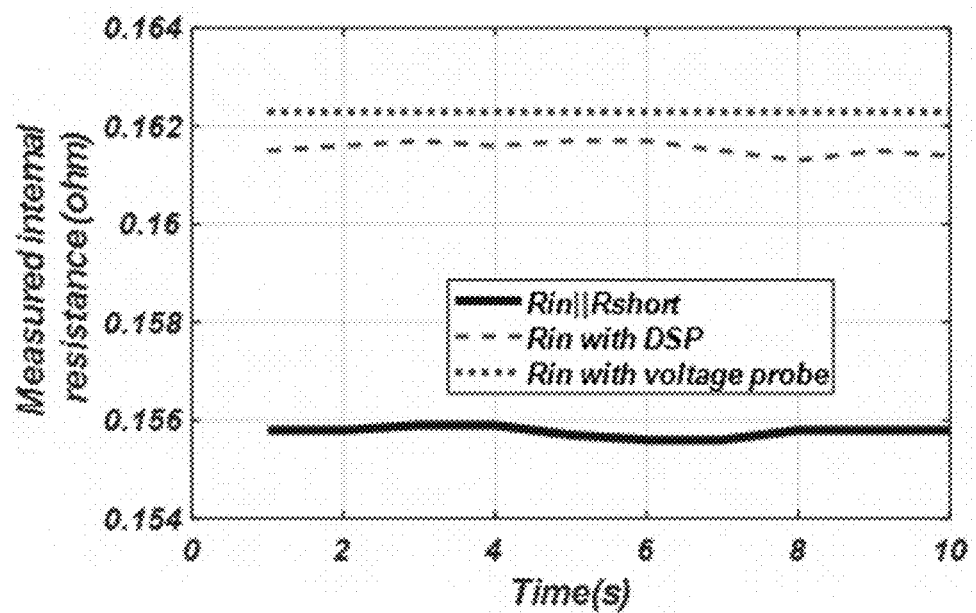
Figure 15B:
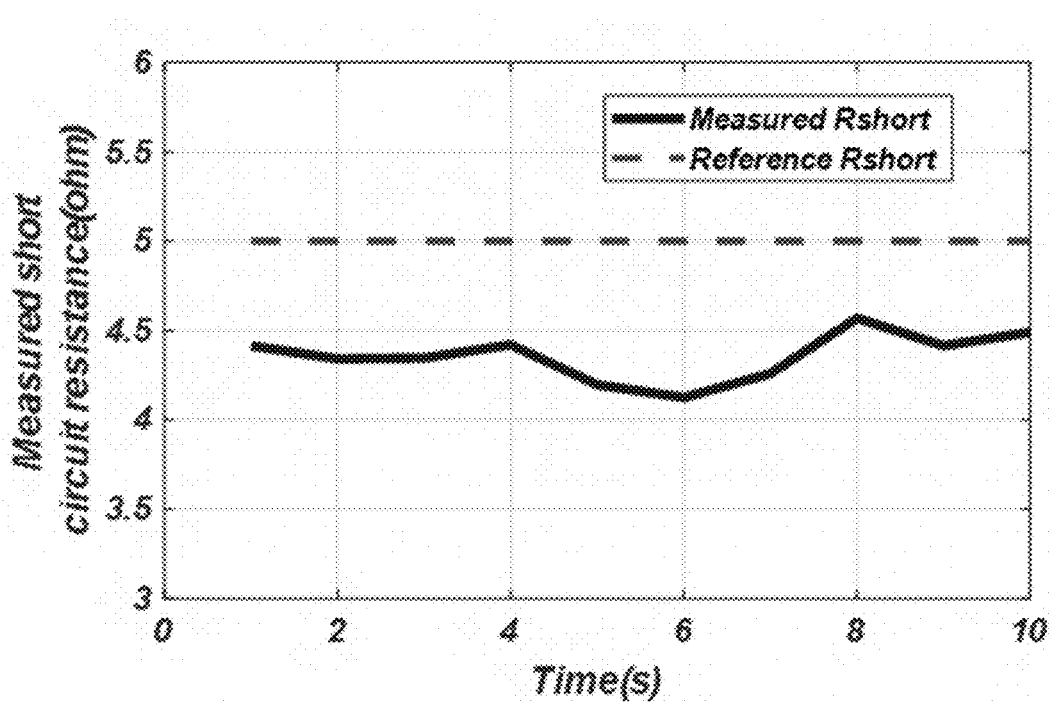
Figure 16A:
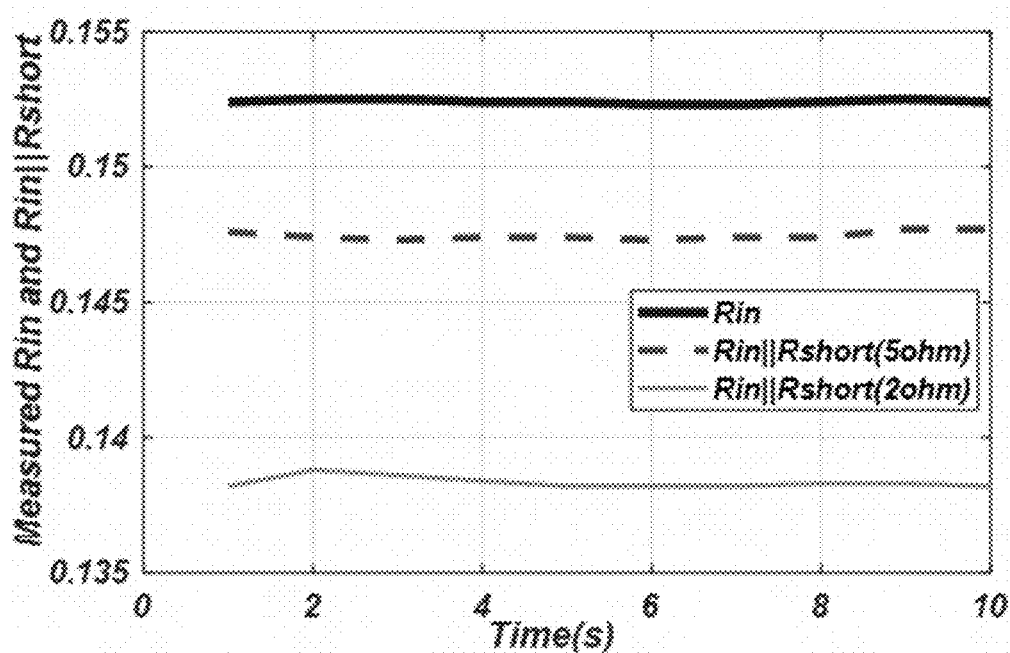
Figure 16B:
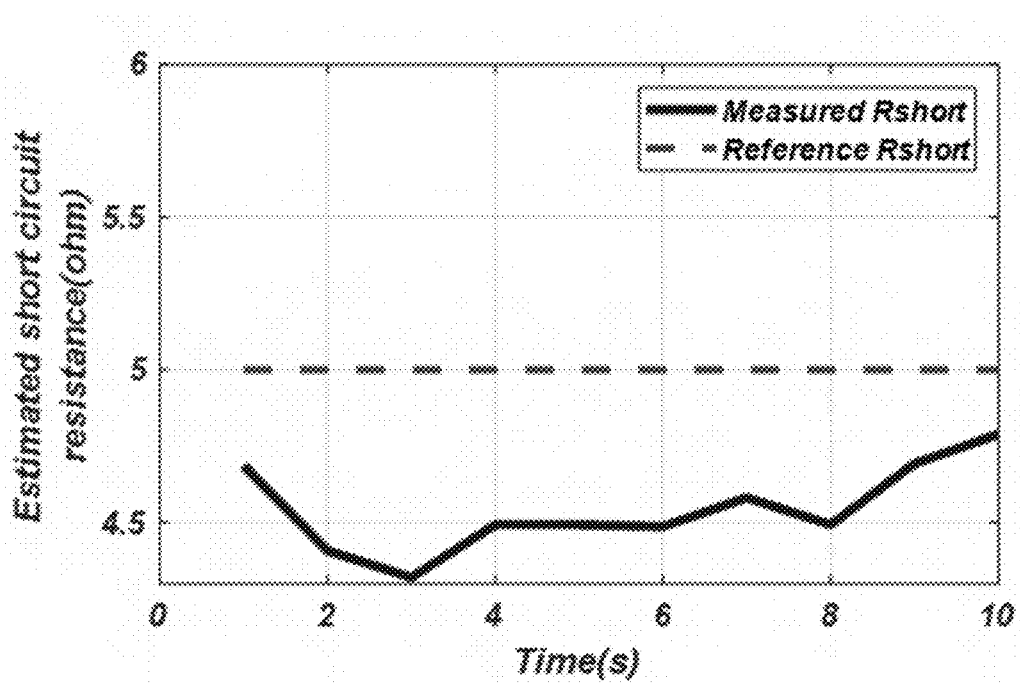
Figure 16C:
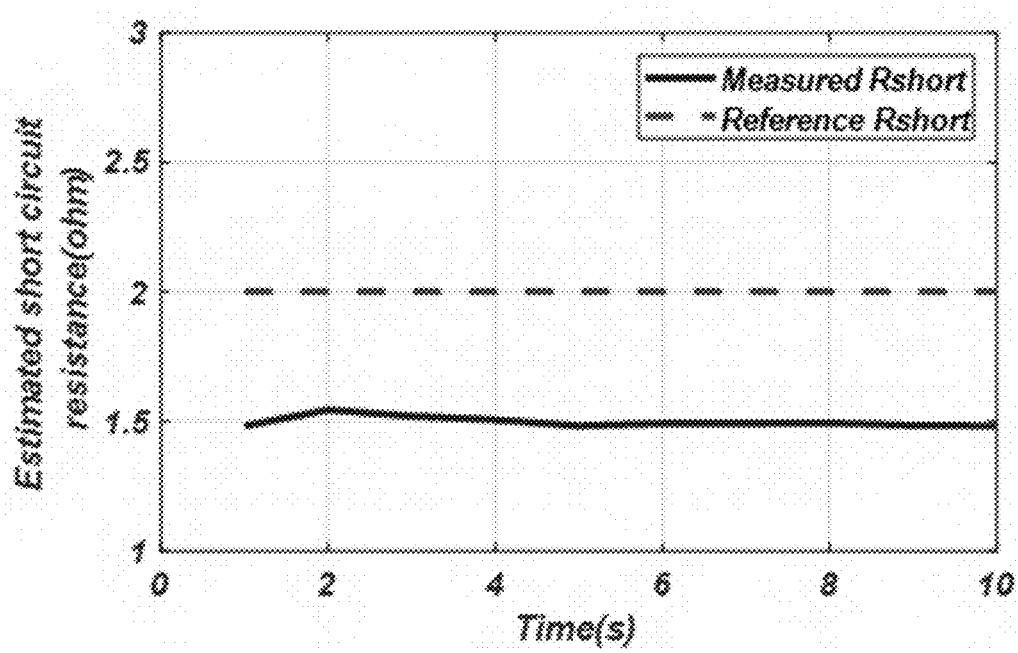
Figure 17:
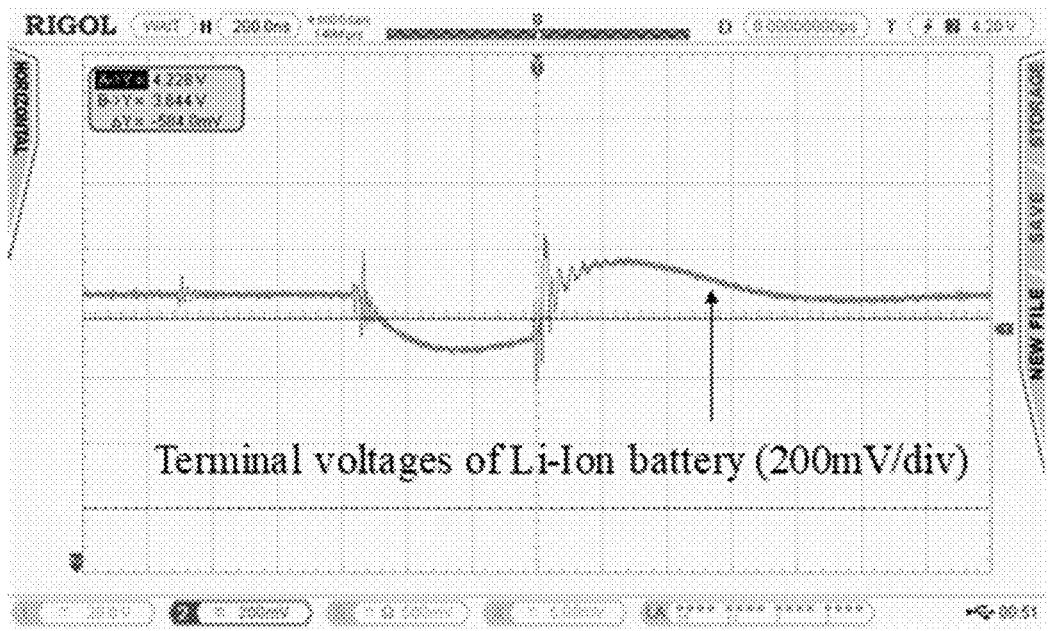
Figure 18A:
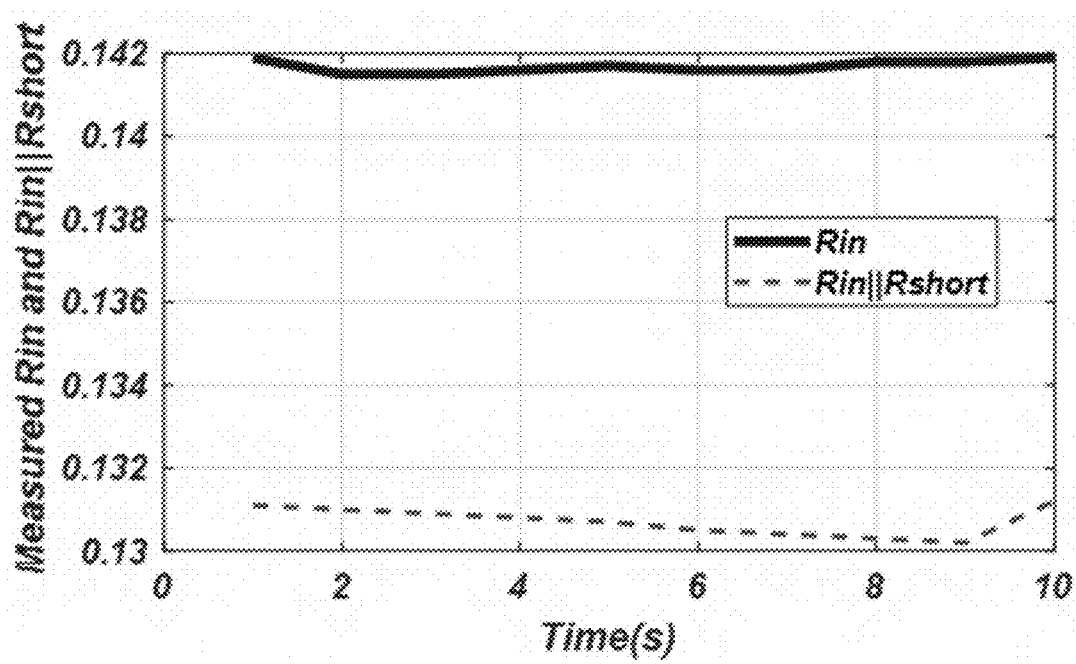
Figure 18B:
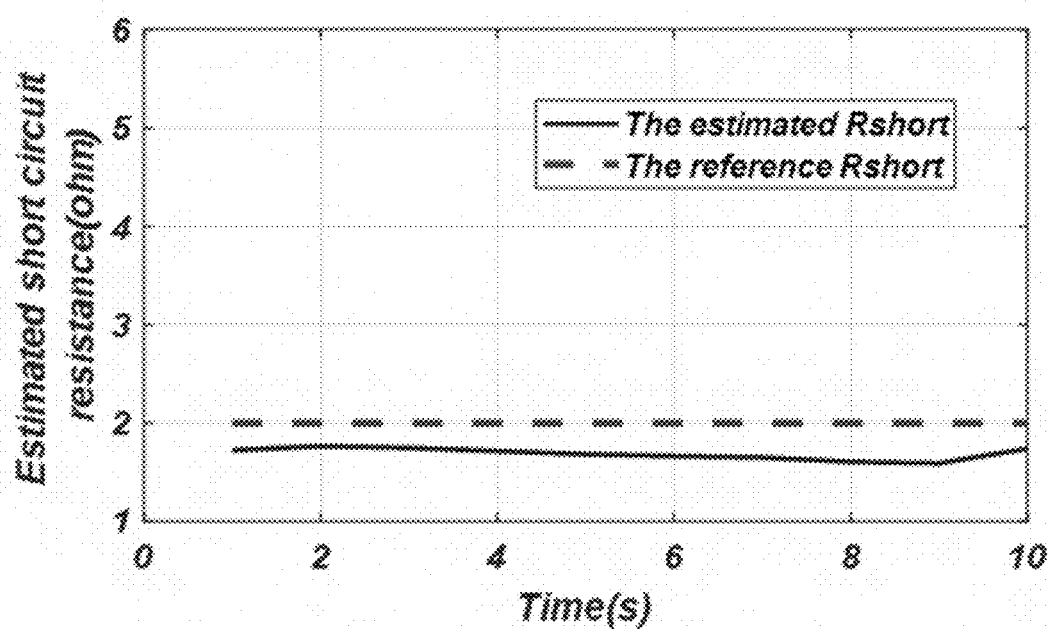

Having thus described some embodiments in general terms, references will now be made to the accompanying drawings, which are not drawn to scale, and wherein:

FIG. 1a illustrates an example structure of a LIB (dimensions are not limited to the sizes listed);

FIG. 1b illustrates an example structure of a cross-sectional view of a LIB showing multiple layers of anodes and cathodes pairs;

FIG. 1c illustrates an example structure of a detailed view of one cycle of anodes and cathodes structures in a LIB;

FIG. 2 illustrates example temperature increases of a LIB resulting from various types of ISCs;

FIG. 3 illustrates an example model of a LIB in an embodiment of the internal short circuit analysis, according to an embodiment of the subject invention;

FIG. 4a illustrates an example resistor-based ISC detection circuit, according to an embodiment of the subject invention;

FIG. 4b illustrates an example transient model of a LIB during an ISC period with a resistor-based ISC detection circuit, according to an embodiment of the subject invention;

FIG. 5a illustrates an inductor-based ISC detection circuit, according to an embodiment of the subject invention;

FIG. 5b illustrates an example measurement circuit for an inductor-based ISC detection technique, according to an embodiment of the subject invention;

FIG. 6 illustrates the time-domain waveforms of circuit parameters in an inductor-based ISC detection, according to an embodiment of the subject invention;

FIG. 7 illustrates an example flowchart of an ISC detection technique, according to an embodiment of the subject invention;

FIG. 8 illustrates an example detection circuit for ISCs of multi-cell LIBs having a first topology, according to an embodiment of the subject invention;

FIG. 9 illustrates an example detection circuit for ISCs of multi-cell LIBs having a second topology, according to an embodiment of the subject invention;

FIG. 10a illustrates simulation results of the described ISC detection techniques for detecting ISCs of a multi-cell LIB showing an estimated $R_{in}$ for the first cell before applying the $R_{short}$ to the terminals of the multi-cell LIB;

FIG. 10b illustrates other simulation results of the described ISC detection techniques for detecting ISCs of a multi-cell LIB showing estimated $R_{short}$ for three cells of the multi-cell LIB when $R_{short1}$=2Ω, $R_{short2}$=5Ω, and $R_{short3}$=8Ω;

FIG. 11a illustrates an example hardware prototype of an inductor-based ISC detection technique;

FIG. 11b illustrates an example hardware prototype of a resistor-based ISC detection technique;

FIG. 12a illustrates an example printed circuit board (PCB) embodiment of an inductor-based ISC detection circuit;

FIG. 12b illustrates an example PCB embodiment of a resistor-based ISC detection circuit;

FIG. 13 illustrates an example time-domain waveform of terminal voltages of a LIB while applying a load via an inductor-based ISC detection circuit;

FIG. 14a illustrates experimental results of an inductor-based ISC detection circuit for $R_{short}$=2Ω without any load and SOC around 70% showing $R_{in}$ measured by a voltage probe and a digital signal processor (DSP) and the measured $R_{in}||R_{short}$;

FIG. 14b illustrates experimental results of an inductor-based ISC detection circuit for $R_{short}$=2Ω without any load and SOC around 70% showing the estimated $R_{short}$;

FIG. 15a illustrates experimental results of an inductor-based ISC detection circuit for $R_{short}$=50 without any load and SOC around 90% showing $R_{in}$ measured by a voltage probe and a DSP and the measured $R_{in}||R_{short}$;

FIG. 15b illustrates experimental results of an inductor-based ISC detection circuit for $R_{short}$=5Ω without any load and SOC around 90% showing the estimated $R_{short}$;

FIG. 16a illustrates experimental results of an inductor-based ISC detection circuit with 0.5 A charging current and SOC around 80% showing $R_{in}$ measured by a DSP and the measured $R_{in}||R_{short}$;

FIG. 16b illustrates experimental results of an inductor-based ISC detection circuit with 0.5 A charging current and SOC around 80% showing the estimated $R_{short}$ when $R_{short}$=5Ω;

FIG. 16c illustrates experimental results of an inductor-based ISC detection circuit with 0.5 A charging current and SOC around 80% showing the estimated $R_{short}$ when $R_{short}$=2Ω;

FIG. 17 illustrates a time-domain waveform of terminal voltages of a LIB while applying a load via a resistor-based ISC detection circuit;

FIG. 18a illustrates experimental results of a resistor-based ISC detection circuit showing $R_{in}$ and $R_{in}||R_{short}$, according to defined test parameters of $R_{short}$=2Ω and $R_{load}$=9Ω; and FIG. 18b illustrates other experimental results of a resistor-based ISC detection circuit showing estimated $R_{short}$, according to defined test parameters of $R_{short}$=2Ω and $R_{load}$=9Ω.

DETAILED DESCRIPTION

LIBs come in various shapes. FIGS. 1a-1c show slab-shaped structures of an exemplary LIB 100. FIG. 1a illustrates an exemplary structural view of a slab LIB, where the illustrated dimensions H, W, D are in mm, but these dimensions are not limited to the sizes listed. The terminals of the battery are denoted by 110. FIG. 1b illustrates a cross-sectional view of a slice of the battery showing multiple pairs of anodes and cathodes, and a corresponding separator between each pair of electrodes. FIG. 1c illustrates a more detailed view of one cycle of the anodes and associated copper current collector, the cathodes and associated aluminum current collector, and the separators as these structures are layered in the battery.

There are four different types of ISCs in LIBs caused by: anode electrode to cathode electrode contact (e.g., which may result from direct contact between anodes and cathodes, for example, as a result of separator puncture), anode electrode to positive current collector (Aluminum) contact (e.g., which may result from partial disintegration and/or displacement of the positive current collector, for example, the separator layer decomposition and reactions of intercalated carbon with electrolyte or dendrite formation due to heating), cathode electrode to negative current collector (Copper) contact (e.g., which may result from partial disintegration and/or displacement of the negative current collector), and positive (Aluminum) to negative (Copper) current collector contact (e.g., which may result from partial disintegration and/or displacement of either/both of the positive and/or negative current collectors). These ISCs can cause rapid increases in the temperature of the battery in a short time, which is a phenomenon known as thermal runaway. However, each type of ISC is characterized by differences in behavior, rates of temperature change, and other characteristics. As illustrated in FIG. 2, the most severe ISCs in LIBs result from undesirable contact between the anode electrode and positive current collector (Aluminum), which is characterized by extremely rapid temperature rise.

There are different techniques to model the ISCs on the LIBs. Both ISCs and ESCs can be modelled by adding a resistance between the terminals of a LIB (e.g., adding a resistance outside the schematic depiction of the battery itself and parallel to the $R_{short}$ resistance shown in FIG. 3) to simulate a short circuit therebetween. This modeling technique is not characterized by the safety concerns of thermal runaway that may result from ISCs and is completely predictable and reproducible, thereby providing a test environment for determining the effectiveness of the short-circuit detection mechanisms discussed herein.

As background, FIG. 3 illustrates an example electrical model of a LIB that is used to model the results of various ISC detection circuits/units discussed herein. The illustrated $R_{ps}C_{ps}$ value of FIG. 3 is the short term time constant of the battery, and $R_{pl}C_{pl}$ value is the long term time cycle of the battery (during LIB battery charging or discharging cycles). In around 500 nanoseconds the load change is applied to the terminals of battery to detect the ISC and the period of applying this load change is about a second. By applying power MOSFET switches, the changes are measured on the load in order to estimate the internal resistance and short circuit resistance of the LIB. By applying a load change on the terminals of the battery quickly and measuring the terminal voltage and current, the effect of $R_{short}$ can be acquired while minimizing potential inaccuracies that may arise from a changing $V_{oc}$ (SOC) value over the duration of the test.

For the first technique, a diagnostic circuit encompasses a test resistance connected and disconnected at the terminals of battery in nanosecond increments via a power switch. The power switch typically is a MOSFET switch. In certain embodiments, the switch needs a few nanoseconds to be turned on and off. With the proposed technique, in a very short period of time, the short circuit resistance of LIBs can accurately be estimated while minimizing energy drain on the battery (and therefore minimizing the change in $V_{oc}$ during the duration of the test). For the second proposed technique, by using an inductor, and an H-bridge in combination with a measurement resistor, $R_{meas}$, the LIB is discharged and charged in less than a microsecond, to minimize the impact of a changing $V_{oc}$ value during the duration of the test. This can help reducing the power loss of the detection circuit from returning energy of the battery that is stored on the inductor, which may be located on an AC-side of the H-bridge topology. The proposed techniques do not need to use $V_{oc}$ (as a function of SOC) characteristic of a battery or estimate the polarization parameters of a battery. As a result, the estimation technique may be conducted in a short time period, which is desirable to detect the severe ISCs or ESCs on the LIBs. Moreover, the proposed technique can detect the ISCs without using any current sensors. The techniques are therefore suitable for use in a wide range of application to increase the safety of LIBs, such as in renewable energy technologies, grid-tied converters, smart grids, EV charging stations, and/or the like.

The proposed techniques can be used to improve safety in such applications as renewable energies, grid-tied converters, smart grids, and EV charging stations.

The working principle of the disclosed ISC detection techniques are explained in the following theory.

When the $R_{short}$ is sufficiently large to be ignored (e.g., during an instance where there is no ISC, such that $R_{short}$ may be modelled as being infinite) and a step load is applied to the terminals of the battery, the Laplace transform equation applicable to FIG. 3 can be obtained by using the following equation:

$$V_b(s) = V_{oc}(SOC) + R_{in}\frac{I_b}{s} + \frac{R_{ps}I_b}{s(\tau_s s + 1)} + \frac{R_{pl}I_b}{s(\tau_l s + 1)}, \quad (1)$$

where $\tau_s$ and $\tau_l$ are the time constants of the polarization parameters of the LIB and can be obtained by $R_{ps}C_{ps}$ and $R_{pl}C_{pl}$, respectively. The time-domain waveforms of the terminal voltage of the battery can be derived from (1) as $$V_b(t) = V_{oc}(SOC) + R_{in}I_b + R_{ps}I_b\left(1 - e^{-\frac{t-t_0}{\tau_s}}\right) + R_{pl}I_b\left(1 - e^{-\frac{t-t_0}{\tau_l}}\right). \quad (2)$$

Equation (2) can be rewritten by using the Taylor series as shown in the following equation when the terms higher than the second order are ignored:

$$V_b(t) = V_{oc}(SOC) + R_{in}I_b - R_{ps}I_b\left(\frac{t-t_0}{\tau_s}\right) - R_{pl}I_b\left(\frac{t-t_0}{\tau_l}\right). \quad (3)$$

Equation (3) can be rewritten as shown in the following equation, when a load change is applied to the terminals of LIBs.

$$\Delta V_b(t) = \Delta V_{oc}(SOC) + R_{in}\Delta I_b - R_{ps}\Delta I_b\left(\frac{t-t_0}{\tau_s}\right) - R_{pl}\Delta I_b\left(\frac{t-t_0}{\tau_l}\right). \quad (4)$$

The term $\Delta V_{oc}$ (SOC) can be ignored when a load change is applied in a very short time period, due to having a very small change on the SOC of battery during the load change. From equation (4), it can conclude that when t is close to $t_0$, equation (4) can be rewritten as shown in the following equation:

$$\Delta V_b(t) \approx R_{in}\Delta I_b = R_{in}\Delta I_t. \quad (5)$$

Also, if there is an internal or external short circuit on the terminals of the battery in FIG. 3 and the load change is applied to the terminals of battery, similar to equations (1)-(5), the following equation can be obtained for the terminal voltage of battery with respect to the current:

$$\Delta V_b(t) \approx (R_{in}\|R_{short})\Delta I_t = Z_{in}\Delta I_t. \quad (6)$$

As shown, if we can apply a certain load change on the terminals of battery in a very short time period, by measuring the terminal voltages of battery, the $R_{short}$ can be estimated by using the following equation:

$$R_{short} = \frac{Z_{in}R_{in}}{R_{in} - Z_{in}}. \quad (7)$$

From equation (7), it is obvious that the $R_{in}$ and $Z_{in}$ can be estimated by applying a load change on the terminals of battery. Two techniques for estimating the $R_{in}$ and $Z_{in}$ for single-cell LIBs are discussed herein.

Resistor-Based ISC Detection Technique

FIG. 4a illustrates an example resistor-based ISC detection circuit 300, according to an embodiment of the subject invention.

In this proposed technique, a test resistance $R_{test}$ is used on the terminals of the battery with a power switch $S_1$ as shown in FIGS. 4a-4b. The power switch $S_1$ can be a MOSFET which takes a few nanoseconds to be turned on and off. The power switch can tolerate high current under moderate voltage, for example, nearly 10 amperes current under 20V.

FIG. 4b shows an example transient modeling of the LIB during the ISC with the resistor-based ISC detection circuit. The $R_{load}$ is the load resistance that is connected to the battery. During charging of the battery, the same circuit can be used to detect the $R_{in}$ and $Z_{in}$. As discussed above, when a change of load happens on the terminals of battery, only the effects of $R_{in}$ and $R_{short}$ can be seen on the terminal voltage of battery as shown in the transient model of a battery in FIG. 4b.

From equation (7), by measuring $\Delta v_t$ and $\Delta i_t$ (measuring $Z_{in}$), the $R_{short}$ can be estimated. The $\Delta i_t$ depends on the terminal voltage in the following equation when $S_1$ is in an "on" state (denoted by ON hereinafter) and the change of current ($\Delta i_t$) is equal to $i_{test}$:

$$\Delta i_t = i_{test} = \frac{v_{gt}(s_1 isON)}{R_{test}}. \quad (8)$$

Without using any current measurement, the resistor-based ISC detection circuit can measure the current change on the terminals of battery. The only measurement that should be done to measure the $R_{short}$ is to measure the terminal voltage of the battery before and after the load change is applied to the LIB. The disadvantage of this technique is the power loss of the battery on the $R_{test}$ to measure the $R_{short}$. To solve this problem, a technique should be used to apply both charging and discharging currents to the battery for detecting the ISCs of LIBs.

Inductor-Based ISC Detection Technique

An inductor-based ISC detection technique provides even further efficiency improvements for ISC detection. FIG. 5a illustrates an example inductor-based ISC detection circuit 400, and FIG. 5b illustrates an example measurement circuit for inductor-based ISC detection technique, according to an embodiment of the subject invention.

The inductor-based ISC detection circuit 400 is designed for the ISC detection of the battery. The inductor-based ISC detection circuit can use a very small inductance (L) (for example, 1 pH) with an H-bridge circuit to apply positive and negative currents to the terminals of the battery. Moreover, a small measurement resistance $R_{meas}$ is used to detect the current change as shown in FIG. 5a. The efficiency benefits of the characteristic of the inductor-based ISC detection technique are at least partially results of the inclusion of the inductor itself, which may return energy to the battery itself to partially "recharge" the battery from energy losses incurred as a result of the ISC detection methodology.

The measurement circuit for the current and voltage measurements utilized in the inductor-based ISC detection circuit of FIG. 5a is shown in FIG. 5b. The operational amplifiers in FIG. 5b are denoted by "op1" and "op2." The main purpose of designing the current measurement circuit is to eliminate the direct current (DC) offset voltage of the battery. However, by designing the values of $R_1$, $R_2$, $R_3$, $R_4$, $R_5$, $R_6$, $R_7$, and $R_8$ shown in FIG. 5b, the magnitude of voltage change on the $R_{meas}$ can be amplified. This amplification helps to estimate the $R_{short}$ more accurately.

In FIG. 5a, when $S_{11}$ (complement of $S_{21}$) and $S_{22}$ (complement of $S_{12}$) are ON ($S_{12}$ and $S_{21}$ are in an "off" state, denoted by OFF hereinafter), $i_d$ is negative and energy transfers from the battery to the inductor L. When the $S_{12}$ and $S_{21}$ are ON ($S_{11}$ and $S_{22}$ are OFF), the $i_d$ is positive and the energy of the inductor L returns to the battery. Accordingly, less energy is dissipated to detect the ISC of the LIB in comparison to the resistor-based circuit illustrated in FIG. 4a.

FIG. 6 illustrates example time-domain waveforms of circuit parameters $V_L$, $I_L$ $I_d$, $S_{21}$, $S_{22}$, and $V_t$ in the inductor-based ISC detection technique. As shown in FIG. 6, in the first period, the polarities of $V_t$ is positive and the current on the inductor $I_L$ increases. However, in the second period, when applying reverse polarities to the inductor L, the $I_L$ decreases and the current in $I_d$ charges the terminals of LIB. It is important to note that due to the continuity of current on the inductor L, when the switches are changed between two periods, the sign and direction of the current $I_d$ is changed.

ISC Detection Methodology

As shown in equation (7), to estimate the $R_{short}$, an estimation of $R_{in}$ should be obtained when there is no short circuit on the terminals of battery. To reach this goal, since the $R_{in}$ is a function of SOC, the $R_{in}$ of battery should be estimated in several SOC intervals in previous charging/discharging cycles. Also, some types of short circuits can lead to thermal runaway in a very short time period (less than several seconds) after the short circuit occurs. Therefore, it is necessary to estimate the $R_{short}$ periodically, for example, at least by the second, to ensure that the severe thermal runaway results can be estimated as fast as possible.

FIG. 7 illustrates an example flowchart of the ISC detection technique based on a resistor-based detection technique, according to an embodiment of the subject invention.

Referring to FIG. 7, firstly, the SOC and time intervals are checked. Because these two intervals are not exactly at the same time and the $R_{in}$ is a function of SOC which is estimated in the previous cycle, the following equation can be used to estimate the $R_{in}$ for different time intervals:

$$R_{in}(SOC, k-1) = \quad (9)$$
$$\frac{R_{in}(SOC_i, k-1) - R_{in}(SOC_{i-1}, k-1)}{SOC_i - SOC_{i-1}} \times (SOC - SOC_{i-1}) +$$
$$R_{in}(SOC_{i-1}, k-1),$$

where i and k are the number counters for SOC and cycles of the battery, respectively.

Referring to FIG. 7, after obtaining the estimated $R_{in}$ from the previous cycle, the current change is applied to the terminals of battery by using the two proposed techniques to estimate the $Z_{in}$ in FIG. 4b. Then, the $R_{short}$ is estimated based on $Z_{in}$ and $R_{in}$ from equation (7). Next, the time interval is checked, if the time interval is not the reason of checking the ISC, the $R_{short}$ is checked to be higher than a threshold value $R_{short-thr}$. Otherwise, the j (the counter of time interval) is increased and the $R_{short}$ is again checked to be higher or lower than the $R_{short-thr}$. In equations (5)-(7), the effect of $R_{load}$ in estimation of $R_{short}$ is ignored. The $R_{short-thr}$ can be selected in order to consider the worst scenario of variations of the $R_{load}$ (changing the $R_{load}$ from the maximum value ($R_{load-max}$) to the minimum value ($R_{load-min}$)) for both the maximum internal resistance ($R_{in-max}$) and the minimum internal resistance ($R_{in-min}$) when the maximum short circuit resistance $R_{short-max}$ that should be estimated is defined based on the application, $$R_{short-thr} = \frac{(R_{in}\|R_{load-min}\|R_{short-max})(R_{in}\|R_{load-max})}{(R_{in}\|R_{load-max}) - (R_{in}\|R_{load-min}\|R_{short-max})}. \quad (10)$$

For example, in a simulation, the $R_{short-max}$ is selected to be 50Ω, $R_{in-max}$=0.2Ω, $R_{in-min}$=0.1Ω, $R_{load-max}$=20Ω, and $R_{load-min}$=952. Based on equation (10), the $R_{short-thr}$=12.329Ω when $R_{in}$=$R_{in-max}$=0.2Ω, and the $R_{short-thr}$=12.276Ω when $R_{in}$=$R_{in-min}$=0.1Ω. Therefore, $R_{short-thr}$ can be selected to be 12Ω considering the effect of variations of $R_{load}$. Furthermore, if the $R_{short}$ is lower than $R_{short-thr}$, then the short circuit is detected on the terminals of battery. Otherwise, if the detection technique happens due to the SOC interval, the estimated $R_{in}$ is equal to $Z_{in}$ and the SOC interval is increased (i=i+1). Finally, the charging or discharging cycles of the battery are checked to reset the i and j counters to be zero for a new cycle of charging and discharging of the battery.

In summary, three voltage drops are experienced by a load or a charger when connected to the terminals of the battery. The initial voltage drop is due to the internal resistance $R_{in}$, which is experienced within several nanoseconds of connecting the load or charger with the battery. The second voltage drop on the terminal voltage of the battery depends on the short term time constant $R_{ps}C_{ps}$, which takes a longer time than the initial voltage drop time. The third voltage drop on the terminal voltage of the battery depends on the long term time constant $R_{pl}C_{pl}$, which takes the longest duration of time to reach a steady-state condition.

New Topologies for Multi-Cell LIBs

Multi-cell LIBs may be used for certain applications. It is also important to design circuits which can detect ISCs within multi-cell LIBs. Two types of circuits are proposed for the detection of ISCs of multi-cell LIBs. FIG. 8 illustrates an example detection circuit for ISCs of multi-cell LIBs having a first topology (i.e., the individual battery cells are provided in parallel), according to an embodiment of the subject invention. FIG. 9 illustrates another example detection circuit for ISCs of multi-cell LIBs having a second topology (i.e., the individual battery cells are provided in series), according to another embodiment of the subject invention.

The principle of operation of these two circuits for multi-cell LIBs are similar to the single-cell resistor-based ISC detection techniques disclosed above, however, it should be understood that inductor-based ISC detection techniques similar to those discussed herein may be utilized in certain multi-cell LIBs configurations. In FIG. 8, a single $R_{test1}$ and a switch $S_1$ are used on the terminals of the battery. When the switch is turned on and off in a very short time period, by measuring the terminal voltage of each cell of the LIB and the current on $R_{test1}$, the internal resistance of each cell can be obtained. Thus, by using the circuit in FIG. 8, the $z_1$, $z_2$, and $z_3$ can be used to estimate $R_{short1}$, $R_{short2}$, and $R_{short3}$. The equation that should be used to estimate the $\Delta i_t$ can be shown as, $$\Delta i_t = \frac{V_{b1}(s_1 isON) + V_{b2}(s_1 isON) + V_{b3}(s_1 isON)}{R_{test1}}. \tag{11}$$

In the second circuit shown in FIG. 9, for each cell of the LIB, a test resistance and a switch are used to apply load change. It is obvious that the $R_{test1}$, $R_{test1}$, and $R_{test3}$ which are used in the second circuit in FIG. 9 are higher than $R_{test1}$ in the first circuit in FIG. 8. However, the number of components that is required for the second circuit is higher than the first circuit which increases the complexity and cost. Moreover, for the first circuit in FIG. 8, the estimation of short circuit resistance of each cell ($R_{short}$) is done for all of the cells at the same time. However, the second circuit in FIG. 9 has the degrees of freedom to check the $R_{short}$ at different time instances for different LIB cells.

Simulation Results

To show the advantages of the proposed technique to estimate the ISCs of LIBs, simulations and test experimentation were implemented on a 3.85V and 3.22 Ah LIB. In order to show advantages of the proposed techniques, simulation results of multi-cell LIBs are shown in FIGS. 10a-10b. The simulation results of the single-cell LIB are not shown here. However, all of the experimental results in present disclosure comprises the two proposed single-cell ISC detection techniques. The parameters used for the simulation results are $R_{in}$=0.1Ω, $R_{test1}$=3Ω, $R_{test2}$=3Ω, and $R_{test3}$=3Ω for the proposed circuit in FIG. 8. In FIG. 10a, the estimation of the $R_{in}$ before applying the $R_{short}$ to the terminals of battery is shown. As shown, by using the multi-cell LIB ISC detection circuit in FIG. 8, the $R_{in}$ can be estimated accurately. This also can be proved for two single-cell and another multi-cell ISC detection technique which are proposed in previous sections herein.

As shown in FIG. 10b, with lower $R_{short}$, the accuracy of estimation increases. As a result, the estimation of $R_{short1}$=2Ω has less error than the estimation of $R_{short3}$=8Ω. This is due to the errors of measurement and uncertainty of components.

The following equation (12) is used in this paper to compare the energy loss of two single-cell ISC detection techniques. In calculation of energy loss, the effects of switching loss, loss of the traces of the PCB layout, and the losses of the measurement and the driver circuits are ignored:

$$E_{loss} = \int P_{loss}(t) dt, \tag{12}$$

where the $E_{loss}$ and $P_{loss}$ are the energy and power losses of the detection technique, respectively. If it is assumed that the currents of detection circuits reach 2 A for both detection techniques and the inductor-based ISC detection technique has 0.5 µs charging and 0.5 µs discharging time durations and the duration of time of discharging of the resistor-based ISC detection technique is 0.5 µs, then the inductor-based ISC detection technique has energy loss of $2.666 \times 10^{-19}$ J and the resistor-based ISC detection technique has energy loss of $4 \times 10^{-6}$ J in each cycle to detect the ISC of the LIB. Even though in calculation of energy loss of the inductor-based detection technique only 0.4Ω is considered for the loss of measurement circuit, loss of the inductor and conduction losses of the power switches and for the resistor-based detection technique only 2Ω resistance is used, the difference between the energy losses of two detection techniques is huge. Therefore, the inductor-based ISC detection technique is more efficient than the resistor-based detection technique. It is important to note that the switching loss is ignored in both detection circuits due to the low switching frequency (1 Hz).

Experimental Results

In order to validate the effectiveness of the proposed ISC detection techniques, both resistor-based and inductor-based circuits are designed as shown in FIGS. 11a-11b. FIG. 11a illustrates an example experimental setup of an inductor-based ISC detection technique. FIG. 11b illustrates an example experimental setup of a resistor-based ISC detection technique.

The battery used in the experiments is similar to the battery used in under the simulation results section above (i.e., a 3.85V and 3.22 Ah LIB). The digital signal processor which is used for the proposed technique is TMS320F2 by Texas Instruments.

As shown in FIGS. 11a-11b, the size of circuits for both techniques are small which is desirable in many applications such as laptops, tablets, and smartphones. Also, similar circuits with higher current and voltage ratings can be used for high power applications such as electrical vehicles, airplanes, and renewable energies. The size of circuits can further be reduced if integrated circuits (ICs) are designed for both of the proposed single-cell circuits (such as the ICs implemented via PCB designs shown in FIGS. 12a-12b). Due to the lack of having a general method to implement a repeatable real ISC on the LIBs and the dangerous gases that are emitted from the LIBs during a real ISC, the ISC is modeled in the experiment by adding a resistance on the terminals of battery.

FIG. 13 illustrates example time-domain waveforms of terminal voltage of the LIB during applying load with an inductor-based ISC detection. As shown, when the $S_{11}$ and $S_{22}$ are ON, the discharging current is obtained from the LIB, which reduces terminal voltage of battery. When the $S_{12}$ and $S_{21}$ are ON, the charging current is injected to the terminals of battery, which increases the terminal voltage of the LIB.

In FIG. 14a, before the $R_{short}$ is added to the terminals of battery, the $R_{in}$ is measured by the DSP and the voltage probe. As shown in FIG. 14a, there is an error between the measured $R_{in}$ with the DSP and the voltage probe. The major reason for the error on the estimations of $R_{short}$ and $R_{in}$ in both simulation and experimental results are caused by the inaccuracies of measurements, uncertainties of components, and calibration errors. In FIG. 14b, the estimated $R_{short}$ is shown when no load is added to the terminals of battery and the SOC of battery is around 70%. As shown in FIG. 14b, the error of estimation of $R_{short}$ is low.

In FIGS. 15a-15b, the estimations of $R_{short}$ and $R_{in}$ are shown when the $R_{short}$ is equal to 5Ω and the SOC is around 90% without applying any load on the terminals of battery. It is obvious from FIGS. 14a-15b that the $R_{in}$ with higher SOC has higher value than the lower SOC. In FIG. 15a, the measured $R_{in}$ with the DSP and the voltage probe are obtained. Also, when the $R_{short}$ is added to the terminals of battery in order to model the ISC, the $R_{in}\|R_{short}$ is obtained in FIG. 15a. In FIG. 15b, the estimated $R_{short}$ has a small error that shows the advantages of the proposed technique to estimate $R_{short}$.

FIGS. 16a-16b illustrate the experimental results of an inductor-based ISC detection with 0.5 A charging current and SOC around 80%. FIG. 16a illustrates $R_{in}$ measured by DSP and the measured $R_{in}\|R_{short}$ for $R_{short}$=2Ω and $R_{short}$=5Ω. FIG. 16b illustrates the estimated $R_{short}$ when $R_{short}$=5Ω. FIG. 16c illustrates the estimated $R_{short}$ when $R_{short}$=2Ω.

FIG. 17 illustrates a time-domain waveform of terminal voltage of a resistor-based ISC detection technique. As shown, when the $R_{test}$=3Ω is applied to the terminals of battery, a sudden voltage change can be seen on the voltage of battery. This sudden voltage change can be used to estimate the $R_{in}$ (before the $R_{short}$ is applied to the battery) and the $R_{in}\|R_{short}$ (after $R_{short}$ is applied to the battery).

FIGS. 18a-18b illustrate the estimation of $R_{short}$ for a resistor-based ISC detection technique when $R_{load}$=9Ω. FIG. 18a illustrates the estimation of $R_{in}$ before applying $R_{short}$=2Ω to the terminals of battery. The result of the estimation of $R_{short}$=2Ω with the resistor-based ISC detection technique is shown in FIG. 18b. It is obvious that there is a small error between the estimated $R_{short}$ and reference value, due to the errors of measurement and calibration of the DSP.

CONCLUSION

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. It should be understood that the examples and embodiments described herein are for illustrative purposes only and that various modifications or changes in light thereof will be suggested to persons skilled in the art and are to be included within the spirit and purview of this application.

In the attached claims, various elements are recited in different claims. However, the claimed elements, even if recited in separate claims, may be used together in any suitable combination.

What is claimed is:

1. A diagnostic circuit for detecting internal short circuits (ISCs) of a lithium-ion battery (LIB), comprising:
   a single cell LIB circuit comprising a first external terminal and a second external terminal; and
   an ISC detection unit connected in parallel with a battery load, the ISC detection unit comprising:
   a test resistor and a switch connected in series;
   wherein a first end of the test resistor and a first end of the battery load connect to the first external terminal of the single cell LIB circuit; and
   wherein a second end of the switch and a second end of the battery load connect to the second external terminal of the single cell LIB circuit.

2. The diagnostic circuit for detecting ISCs of the LIB in claim 1, wherein the switch is configurable between an off configuration in which an ISC resistance is not measured, and an on configuration in which a transient current passes through the test resistor to measure the ISC resistance.

3. The diagnostic circuit for detecting ISCs of the LIB in claim 1, wherein the test resistor has a resistance between 2 ohms and 10 ohms.

4. The diagnostic circuit for detecting ISCs of the LIB in claim 2, wherein the ISC resistance is measured between the first external terminal and the second external terminal of the single cell LIB circuit when the switch is in the on configuration.

5. The diagnostic circuit for detecting ISCs of the LIB in claim 2, wherein changing the switch from the off configuration to the on configuration creates a change in load on the LIB, and wherein the diagnostic circuit is configured to detect an ISC based at least in part on the change in load on the LIB.

6. The diagnostic circuit for detecting ISCs of the LIB in claim 5, wherein detecting an ISC based at least in part on the change in load on the LIB comprises measuring a terminal voltage of the LIB while the switch is in the off configuration and measuring a terminal voltage of the LIB while the switch is in the on configuration.

7. A diagnostic circuitry for detecting ISCs of a multi-cell LIB comprising a plurality of single cell LIB circuits, the diagnostic circuitry comprising a plurality of ISC detection units as described in claim 1, wherein each ISC detection unit connects in parallel with a single cell LIB circuit of the multi-cell LIB, and wherein the plurality of ISC detection units connect in series with a second terminal of a previous ISC detection unit connecting to a first terminal of a next ISC detection unit.

8. A diagnostic circuitry for detecting ISCs of a multi-cell LIB comprising a plurality of single cell LIB circuits as described in claim 1, the plurality of single cell LIB circuits connecting in series from a first single cell LIB circuit to a last single cell LIB circuit, the diagnostic circuitry comprising the ISC detection unit, wherein the first end of the test resistor connects to a first external terminal of the first single cell LIB circuit, and wherein the second end of the switch connects to a second external terminal of the last single cell LIB circuit.

9. A diagnostic circuit for detecting internal short circuits (ISCs) of a lithium-ion battery (LIB), comprising:
 a single cell LIB circuit having a first external terminal and a second external terminal; and
 an ISC detection unit connected in parallel with a battery load, the ISC detection unit comprising:
  a measurement resistor and an H-bridge connected in series;
  wherein a first end of the measurement resistor and first end of the battery load connect to the first external terminal of the single LIB circuit, and wherein a second end of the H-bridge and a second end of the battery load connect to the second external terminal of the single cell LIB circuit;
  wherein the H-bridge comprises an inductor and four switches, wherein the inductor is in the center of the H-bridge, and the four switches are arranged to be on two arms of the H-bridge; and
  wherein two top ends of the H-bridge connect to the first external terminal of the single cell LIB circuit through the measurement resistor, and two bottom ends of the H-bridge connect to the second external terminal of the single cell LIB circuit.

10. The diagnostic circuit for detecting ISCs of claim 9, wherein the four switches are each configurable between an off configuration and an on configuration, and wherein an ISC resistance is not measured when the four switches are all in an off configuration, and wherein a transient current passes through the measurement resistor when two switches of the four switches are in an on configuration to form a closed circuit path between the first end of the measurement resistor and the second end of the H-bridge within the ISC detection unit for detecting the ISC resistance.

11. The diagnostic circuit for detecting ISCs of claim 9, wherein an ISC resistance is measured between the first external terminal and the second external terminal of the single cell LIB circuit.

12. The diagnostic circuit for detecting ISCs of claim 10, wherein changing two of the switches from the off configuration to the on configuration creates a change in load on the LIB, and wherein the diagnostic circuit is configured to detect an ISC based at least in part on the change in load on the LIB.

13. The diagnostic circuit for detecting ISCs of claim 12, wherein detecting an ISC based at least in part on the change in load on the LIB comprises measuring a terminal voltage of the LIB while the switches are in the off configuration and measuring a terminal voltage of the LIB while two of the switches are in the on configuration.

\* \* \* \* \*